(12) United States Patent
Spencer et al.

(10) Patent No.: US 9,844,157 B1
(45) Date of Patent: Dec. 12, 2017

(54) GASKET FOR AN ELECTRONIC DEVICE

(71) Applicant: Apple Inc., Cupertino, CA (US)

(72) Inventors: Maegan K. Spencer, Emerald Hills, CA (US); Katherine E. Tong, San Francisco, CA (US); Erik G. De Jong, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/182,205

(22) Filed: Jun. 14, 2016

(51) Int. Cl.
*H05K 5/06* (2006.01)
*H05K 5/02* (2006.01)
*H05K 5/03* (2006.01)

(52) U.S. Cl.
CPC ......... *H05K 5/0217* (2013.01); *H05K 5/0221* (2013.01); *H05K 5/03* (2013.01)

(58) Field of Classification Search
CPC .......... H05K 5/00; H05K 5/02; H05K 5/0217; H05K 5/0221; H05K 5/03; H05K 5/061; H02G 3/08; H02G 3/081; H02G 3/088; F16J 15/00; F16J 15/02; F16J 15/062; F16J 15/024
USPC ........ 174/50, 17 R, 17 CT, 650, 152 G, 135, 174/153 G, 152 R, 50.51, 520; 277/590, 277/596, 602, 644, 645, 647
See application file for complete search history.

(56) References Cited

U.S. PATENT DOCUMENTS

| | | | | |
|---|---|---|---|---|
| 2,764,311 A | * | 9/1956 | BLackman | F16J 15/121 277/641 |
| 4,298,204 A | * | 11/1981 | Jinkins | F16J 15/062 277/641 |
| 6,361,049 B1 | * | 3/2002 | Joco | F16J 15/062 277/312 |
| 7,423,217 B2 | * | 9/2008 | Pape | H02G 3/088 174/17 CT |
| 7,733,642 B2 | * | 6/2010 | Liou | G02F 1/133308 361/679.41 |
| 7,828,302 B2 | * | 11/2010 | Hurlbert | F16J 15/125 277/637 |
| 8,269,104 B2 | * | 9/2012 | Choraku | H05K 5/061 174/50 |
| 8,519,264 B2 | * | 8/2013 | Leslie | H02G 3/088 174/50 |
| 8,937,246 B2 | * | 1/2015 | Yamaguchi | H05K 5/061 174/50 |
| 9,167,876 B2 | * | 10/2015 | Yamaguchi | H05K 5/061 |
| 9,248,944 B2 | * | 2/2016 | Miyagawa | F16J 15/024 |

* cited by examiner

*Primary Examiner* — Angel R Estrada

(74) *Attorney, Agent, or Firm* — Downey Brand LLP

(57) ABSTRACT

An electronic device having an enclosure and a cover is disclosed. The cover may be secured with the enclosure by a sealing element, or gasket. In response to using the sealing element to secure the cover with the enclosure, the sealing element may elastically deform. The elastic deformation may cause portions of the sealing element to extend into undercut regions of the cover and of the enclosure to form a first locking feature and a second locking feature, respectively. The first locking feature and the second locking feature may combine to provide a retaining force that retains the cover with the enclosure. Also, the first locking feature and the second locking feature may also provide a counter-force to a force applied to the electronic device (for example, dropping the electronic device) that prevents the cover from becoming unsecured from the enclosure.

20 Claims, 20 Drawing Sheets

GASKET FOR AN ELECTRONIC DEVICE

FIELD

The following description relates to electronic devices. In particular, the following description relates to coupling together parts of an electronic device together by a gasket, or seal, that also provides a locking feature that retains the parts in a coupled manner.

BACKGROUND

An electronic device may include an enclosure and a cover secured to the enclosure. The cover allows for added features of the electronic device. For example, the cover may protect internal components of the electronic device. An adhesive may be used to a primary bond to secure the cover to the housing.

However, using an adhesive to provide the primary bond between the transparent piece of material and the housing has several drawbacks. For example, adhesives tend to break down when exposed to heat. Further, when the electronic device is a wearable electronic device, the adhesive may be exposed to skin oils as well as topical formulas placed on the skin, either of which may break down the adhesive bond formed by the adhesive. Further, when the electronic device is dropped, a load or force applied to the electronic device (from the drop) may cause the transparent piece of material to disengage from the housing.

SUMMARY

In one aspect, an electronic device is described. The electronic device may include an enclosure having an opening and an enclosure undercut surrounding the opening. The electronic device may further include a cover carried by the enclosure at the opening. The cover may include a cover undercut. The electronic device may further include a sealing element securing the cover with the enclosure by extending to engage: 1) the enclosure undercut to define a first locking feature and 2) the cover undercut to define a second locking feature. In some embodiments, the first locking feature and the second locking feature combine to retain the cover with the enclosure.

In another aspect, an electronic device is described. The electronic device may include a first part. The electronic device may further include a second part. The electronic device may further include a sealing element disposed between the first part and the second part. The sealing element may elastically deform in a first direction and a second direction opposite the first direction when the first part is coupled with the second part.

In another aspect, a method for assembling an electronic device having an enclosure that includes an opening and an enclosure undercut surrounding the opening is described. The method may include coupling a sealing element with a cover. The method may further include coupling the sealing element and the cover with the enclosure at the opening. The cover may include a cover undercut. In some embodiments, coupling the cover with the enclosure causes the sealing element to extend and engage: 1) the cover undercut to define a first locking feature and 2) the enclosure undercut to define a second locking feature.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
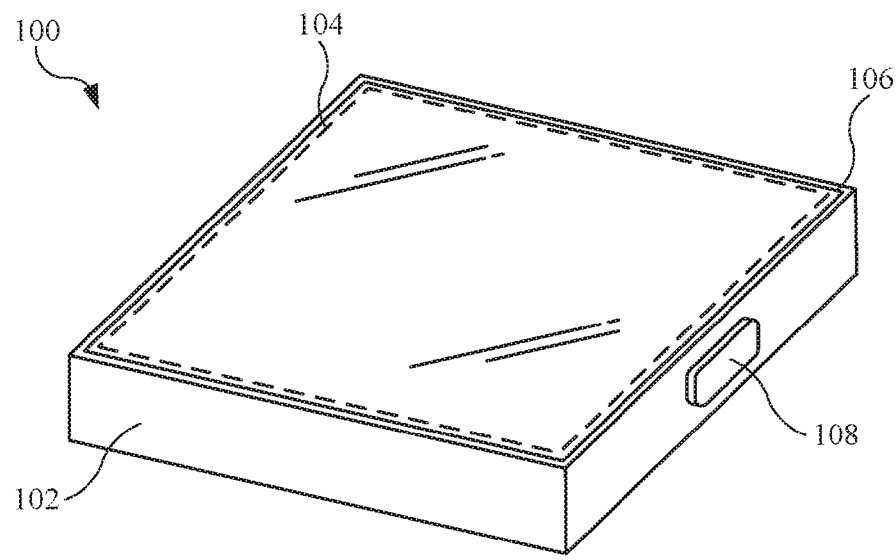
FIG. 1 illustrates an isometric view of an embodiment of an electronic device, in accordance with some described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to a sealing element, or gasket, designed to secure together structural components of an electronic device. For example, the sealing element may couple together a cover with an enclosure of the electronic device. The sealing element may not only provide securing means between the components, but also prevent ingress of contaminants (such as liquids) from entering the electronic device at an interface region between the sealing element and the enclosure, and at an interface region between the sealing element and the cover. In some instances, the sealing element is initially installed on the cover by, for example, press fitting the sealing element onto the cover. The press fitting may stretch the sealing element and cause the sealing element to secure with the cover by frictional forces. Then, the combination of the cover and the sealing element may be inserted into an opening of the enclosure designed to receive the cover and the sealing element.

The sealing element may provide an enhanced alternative to adhesive bonds used to secure components of traditional electronic devices. For example, the sealing element may include a material (or materials) having an elasticity that causes the sealing element, in response to an applied force caused by the cover and/or the enclosure, to elastically deform to regions of the cover and/or enclosure that are engaged with the sealing element. The sealing element may also provide a counterforce against both the cover and the enclosure, thereby retaining the cover with the enclosure while the sealing element is under compression. However, in some cases, the cover and enclosure may include an undercut region that allows the sealing element to extend into and engage the respective undercut regions. "Undercut" or "undercut region" as used throughout this detailed description and in the claims refers to a space formed by the removal or absence of material from a structural component, thereby defining a recessed portion in the structural component. For example, the enclosure may include an undercut region formed by removing material from the enclosure. As non-limiting examples, material removal means may include cutting operations performed by computer number controller ("CNC") tools and laser cutting tools.

The undercut regions being free of material minimize or prevent compression forces to the sealing element, thereby allowing some portions of the sealing element to extend outward respect to the sealing element, into the undercut regions. The outward extension may include a radially outward extension. This may enhance the ability of the sealing element to retain the cover with the enclosure. For example, when sealing element elastically deforms to extend into (or at least partially extend into) an undercut region of the cover, the extended portion of the sealing element may provide a lock, or locking feature, between the sealing element and the cover. Further, the sealing element can also elastically deform to extend into (or at least partially extend into) an undercut region of the enclosure can provide a second lock, or second locking feature, between the sealing element and the enclosure. In this manner, in addition to provide a retaining force under compression, the sealing element further provides locking features by extending outward into undercut regions of the cover and the enclosure.

These and other embodiments are discussed below with reference to FIGS. 1-29. However, those skilled in the art will readily appreciate that the detailed description given herein with respect to these Figures is for explanatory purposes only and should not be construed as limiting.

FIG. 1 illustrates an isometric view of an embodiment of an electronic device 100, in accordance with some described embodiments. In some embodiments, the electronic device 100 is a tablet computer device. In the embodiment shown in FIG. 1, the electronic device 100 is a mobile wireless communication device, such as a smartphone. As shown, the electronic device 100 may include an enclosure 102. The enclosure 102 may be formed from a metal, such as steel (including stainless steel), steel alloy, aluminum, or aluminum alloy. Alternatively, the enclosure 102 may be formed from non-metal materials, such as ceramic or rigid plastic, as non-limiting examples. The electronic device 100 may further include a display assembly 104 designed to present visual information in the form of illuminated images, text, or the like. The display assembly 104 may be covered by an outer protective layer 106 that may be formed from a transparent material, such as glass, sapphire, crystal, or the like. The display assembly 104 may respond to a depression or force at the outer protective layer 106 by generating an input to a processor circuit (not shown) disposed in an internal cavity defined by the enclosure 102. In this regard, the display assembly 104 may operate in conjunction with a sensor system (not shown). The input caused by the depression or force to the outer protective layer 106 may cause the processor circuit to execute a program stored on a memory circuit (not shown) and alter the visual information presented on the display assembly 104. Also, the electronic device 100 may include an internal power supply (not shown), such as a battery, that provides electrical current to the processor circuit and the memory circuit. In addition, the electronic device 100 may include an input feature 108 designed for actuation by a user to generate a command to the processor circuit. In some embodiments, the input feature 108 is a moving or sliding switch. In other embodiments, the input feature 108 is a dial or rotary mechanism. In the embodiment shown in FIG. 1, the input feature 108 is a button that is actuated by a depression or force.

Figure 2:
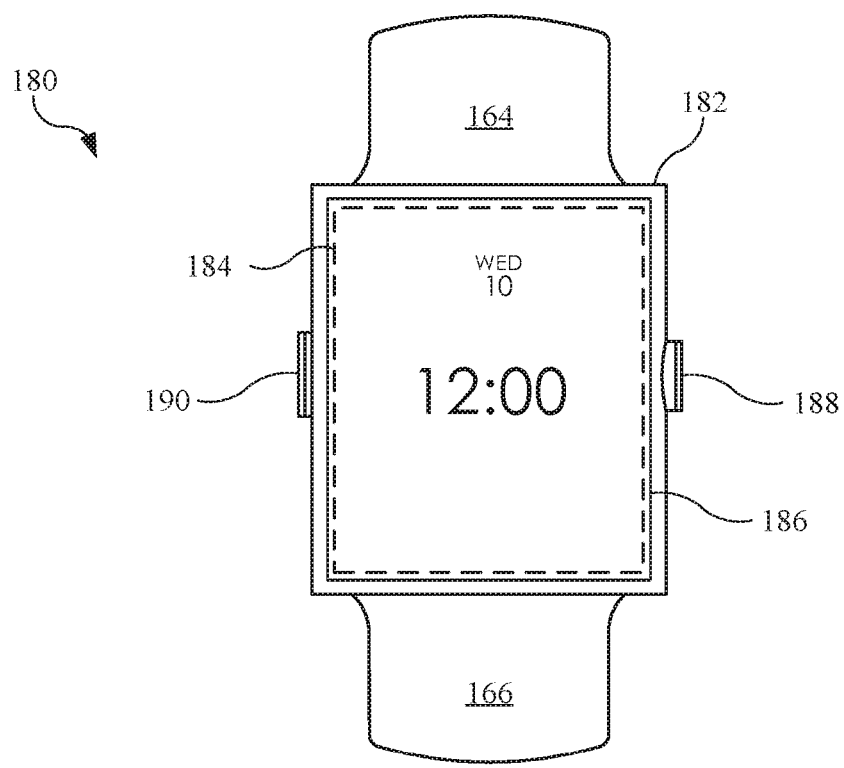
FIG. 2 illustrates a front view of an alternate embodiment of an electronic device, in accordance with some described embodiments.

Further, an electronic device described in this detailed description may take other forms. For example, FIG. 2 illustrates a front view of an alternate embodiment of an electronic device 180, in accordance with some described embodiments. As shown, the electronic device 180 may include an enclosure 182, a display assembly 184, and an outer protective layer 186. The enclosure 182, display assembly 184, and outer protective layer 186 may include any material or feature previously described for an enclosure, display assembly, and outer protective layer, respectively. Also, the electronic device 180 may include a first input feature 188 and a second input feature 190, both of which may be designed to provide a command to a processor circuit (not shown) in response to actuation by a user. The first input feature 188 and/or the second input feature 190 may include any feature or features previously described for an input feature of an electronic device.

Also, in the embodiment shown in FIG. 2, the electronic device 180 is a wearable electronic device. In this regard, the electronic device 180 may include a feature designed to secure the electronic device 180 around an appendage (such as a wrist) of a user. For example, the electronic device 180 may include a first band 164 and a second band 166. The first band 164 and the second band 166 may combine to wrap around the appendage and interlock together. Also, although not shown, the enclosure 182 may include a first cavity and a second cavity to receive the first band 164 and the second band 166, respectively.

Figure 3:
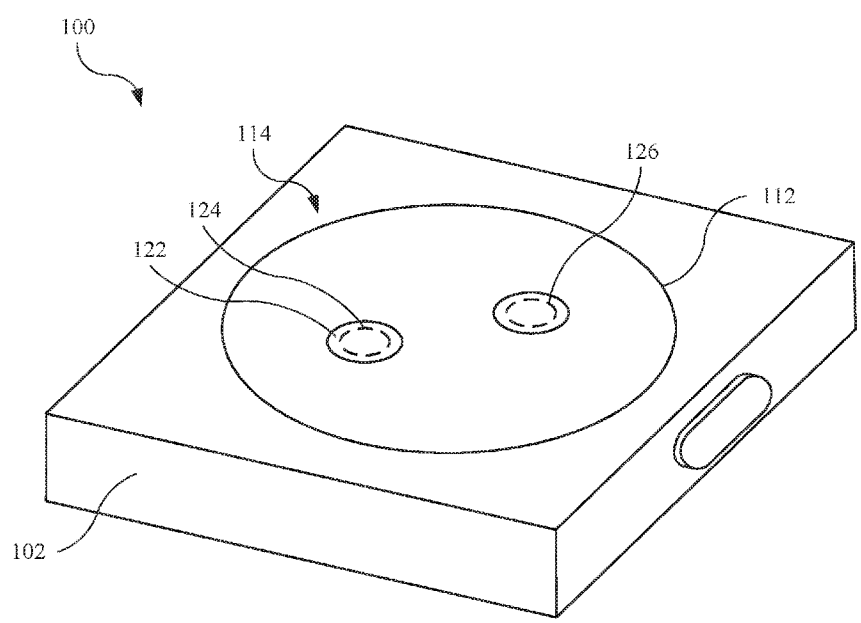
FIG. 3 illustrates a rear isometric view of the electronic device shown in FIG. 1, showing a cover of the electronic device.

FIG. 3 illustrates a rear isometric view of the electronic device 100 shown in FIG. 1, showing a cover 112 of the electronic device 100. The cover 112 may be disposed in an opening 114 of the enclosure 102 and secured with the enclosure 102 by a sealing element, or gasket (not shown). This will be shown and described in detail below.

In some embodiments, the cover 112 is formed from an opaque material and prevents or obscures light passage. However, the cover 112 may include one or more openings. In this regard, a transparent material 122 may be positioned behind the cover 112 and at a location corresponding to the openings. The transparent material 122 allows light transmission through the openings of the cover 112. The transparent material 122 may include sapphire, glass, crystal, or the like. In this regard, the cover 112 may be used by the electronic device 100 as a protective cover for internal components while allowing a detection mechanism disposed inside the electronic device 100 to transmit light through the cover 112 (by way of the transparent material 122) and receive at least some of the light, reflected back by an object, in order to collect data. For example, in some embodiments, the detection mechanism includes a light transmitter 124 and a light receiver 126. The openings of the cover 112, along with the transparent material 122, permit light transmission by the light transmitter 124 through the cover 112 and may also permit light provided from the light transmitter 124 to reflect and return through the cover 112 to the light receiver 126. A processor circuit (not shown) may be designed to execute a program on a memory circuit (not shown) that uses the light received by the light receiver 126 to determine various characters. For example, when the electronic device 100 is used as a wearable electronic device (such as the electronic device 180 shown in FIG. 2), the electronic device 100 may be positioned such that the light transmitter 124 and the light receiver 126 are facing an appendage of a user, allowing the electronic device 100 to collect data about the user by light transmitted by the light transmitter 124 and received by the light receiver 126. Also, a battery (not shown) may be used to supply electrical current to the light transmitter 124, the light receiver 126, the processor circuit, and the memory circuit. Also, it should be noted that the electronic device 180 (shown in FIG. 2) may include several features—including the cover 112, the light transmitter 124, and the light receiver 126—shown and described for the electronic device 100. While a specific transmitter/receiver pair are shown and described, other various detection mechanisms are possible.

Figure 4:
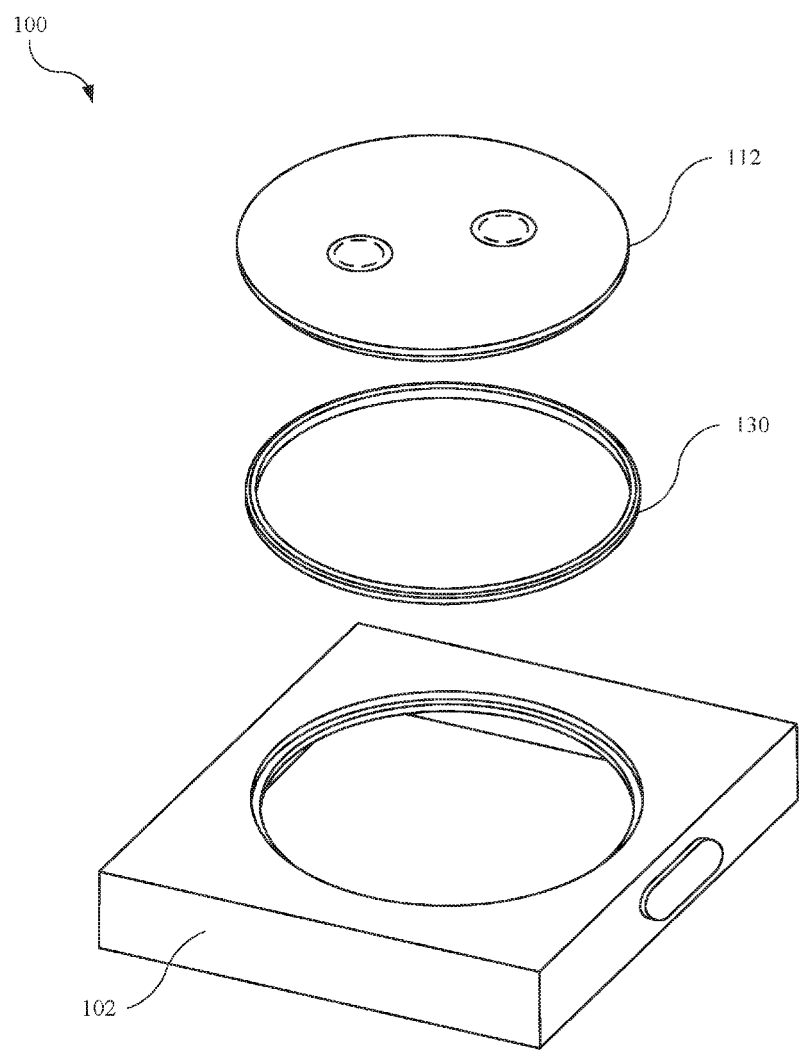
FIG. 4 illustrates a rear exploded view of the electronic device shown in FIG. 1, showing a sealing element designed to secure the cover with the enclosure.

FIG. 4 illustrates a rear exploded view of the electronic device 100 shown in FIG. 1, showing a sealing element 130 designed to secure the cover 112 with the enclosure 102. For purposes of simplicity, several internal components (such as a processor circuit and a memory circuit) of the electronic device 100 are removed. The sealing element 130 may include a body designed to compress in response to a force provided by the cover 112 and/or the enclosure 102 when the cover 112 is coupled with the enclosure 102 (shown later). However, when compressed, the sealing element 130 may provide a counterforce to retain the cover 112 with the enclosure 102. This not only provides a retaining force for the cover 112 to maintain coupling with the enclosure 102, but also provides ingress protection against contaminants at the interface between the sealing element 130 and the cover 112, as well as the interface between the sealing element 130 and the enclosure 102.

While the sealing element 130 may include the aforementioned compressible properties, the sealing element 103 may also return to its original size and shape when the compression forces are removed. Also, in some embodiments, the sealing element 130 is formed from polytetrafluoroethylene ("PTFE"). In other embodiments, the sealing element 130 is formed from ethylene tetrafluoroethylene ("ETFE"). Still, in other embodiments, the sealing element 130 is formed from a viscoelastic material such that the sealing element 130 both viscous to resist at least some shear stresses and elastic to at least partially deform. Other elastically deformable materials may be used to form the sealing element 130.

Figure 5:
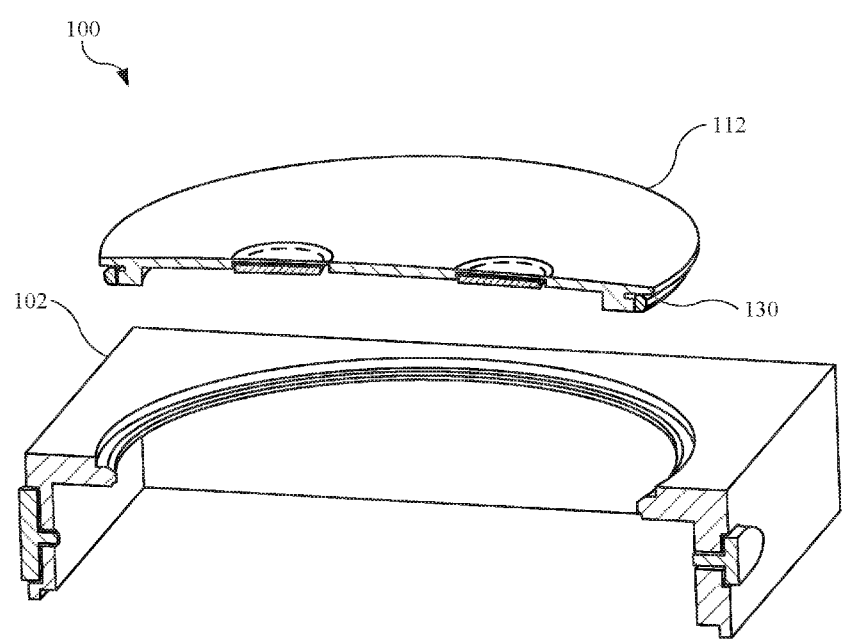
FIG. 5 illustrates a partial cross sectional view of the electronic device shown in FIG. 4, showing the sealing element secured with the cover.

FIG. 5 illustrates a partial cross sectional view of the electronic device 100 shown in FIG. 4, showing the sealing element 130 secured with the cover 112. Several components are removed for purpose of simplicity. As shown, the sealing element 130 may be fit onto the cover 112 prior to securing the cover 112 with the enclosure 102. The elastic properties of the sealing element 130 allow the sealing element to be press fit onto the cover 112, and the sealing element 130 may be frictionally coupled with the cover 112. However, in addition to press fitting the sealing element 130 onto the cover 112, the sealing element 130 may also be adhesively secured with the cover 112 by an adhesive (not shown). Also, although not shown, the sealing element 130 may be secured with the enclosure 102 prior to securing with the cover 112.

Figure 6:
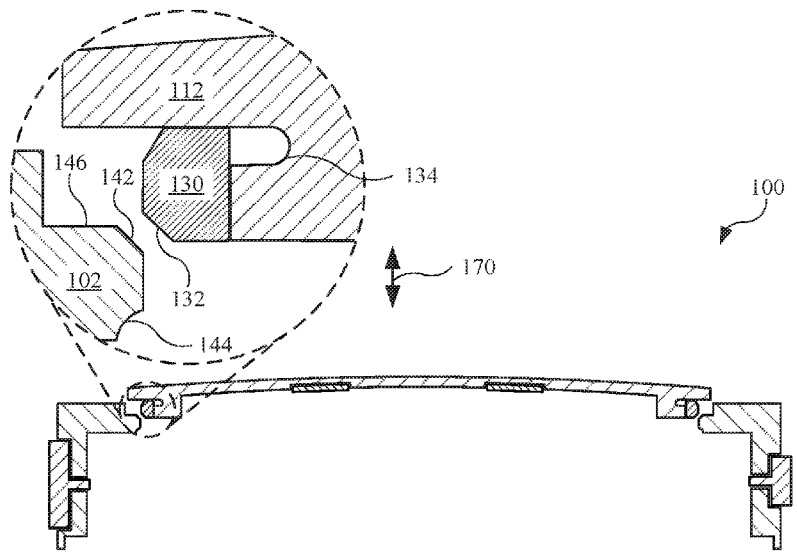
FIG. 6 illustrates a cross sectional view of the electronic device shown in FIG. 5, showing the cover prior to securing with the enclosure.

FIG. 6 illustrates a cross sectional view of the electronic device 100 shown in FIG. 5, showing the cover 112 prior to securing with the enclosure 102. In some embodiments, the sealing element 130 includes a generally rounded cross section. However, as shown in the enlarged view, the sealing element 130 may include a multi-sided cross section. This may facilitate installation of cover 112 with the enclosure 102. For example, the sealing element 130 may include a chamfered region 132 that facilities sliding the sealing element 130 along the enclosure 102. Further, the enclosure 102 may include a chamfered region 142 that further facilitates movement of the sealing element 130 along the enclosure 102. The described chamfered regions may define regions free of material that limit forces acting on the structural components. For example, the chamfered region 132 of the sealing element 130 and the chamfered region 142 of the enclosure 102 may limit or prevent axial forces (in either direction denoted by a two-sided arrow 170) from damaging the sealing element 130 during installation.

Additional structural modifications may be used to facilitate installation and retain the cover 112 with the enclosure 102. For example, the cover 112 may include an undercut region 134, or cover undercut, formed by removing material from the cover 112. Also, the enclosure 102 may also include an undercut region 144, or enclosure undercut, formed by removing material from the enclosure 102. The aforementioned undercut regions may allow the sealing element 130 to extend, or at least partially extend, into the cover 112 and the enclosure 102 in locations corresponding to their respective undercut regions. This will be shown and described below. Further, the enclosure 102 may include a support member 146, or support, designed to receive and engage the cover 112. Also, although a cross section is shown, the remaining regions of the cover 112 and the enclosure 102 may generally be consistent with the cross section. While the aforementioned undercut regions are described as being formed by removing material, in some embodiments (not shown), the undercut regions are formed by a molding operation used to form the structural components having the undercut regions. For example, in some embodiments, the undercut region 144 of the enclosure 102 is formed based on a mold cavity (not shown) use to form the enclosure 102 such that the undercut region 144 is formed with the enclosure 102.

Figure 7:
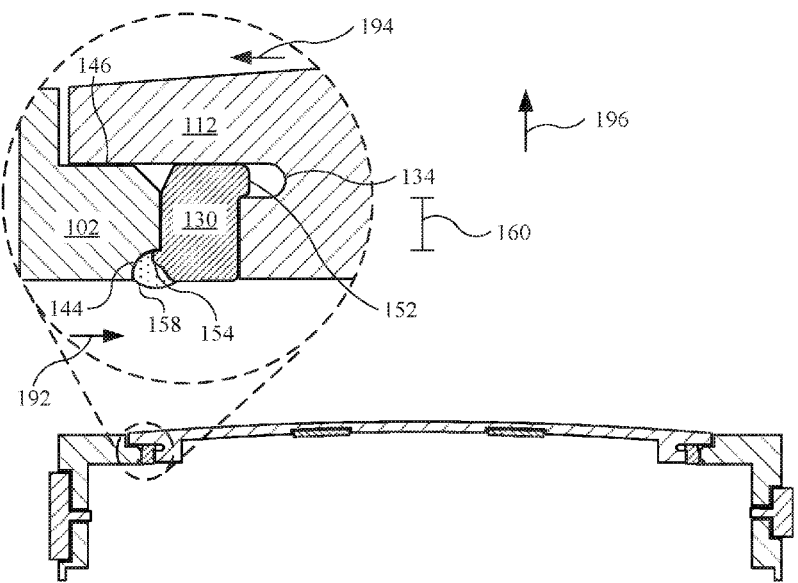
FIG. 7 illustrates a cross sectional view of the electronic device shown in FIG. 6, showing the cover secured with the enclosure.

FIG. 7 illustrates a cross sectional view of the electronic device 100 shown in FIG. 6, showing the cover 112 secured with the enclosure 102. When the cover 112 is installed in the enclosure 102 (as shown in FIG. 7), the enclosure 102 and the cover 112 may provide radial compressions forces to the sealing element 130. For example, the enclosure 102 may provide a radial compression force to the sealing element 130 in a direction (denoted by an arrow 192) toward the cover 112. Conversely, the cover 112 may provide a radial compression force to the sealing element 130 in a direction (denoted by an arrow 194) toward the enclosure 102.

In response to the aforementioned radial compression forces, the sealing element 130 may provide a counterforce against the radial compression forces. For example, the sealing element 130 may provide counterforces opposite the direction of the arrow 192 and also opposite the direction of the arrow 194. Further, the sealing element 130 may expand along areas that do not undergo compression forces. For example, as shown in FIG. 7, the sealing element 130 may extend into the undercut region 134 of the cover 112, thereby forming a first locking feature 152. The first locking feature 152 may include a portion of the sealing element 130 positioned in the undercut region 134 of the cover 112. The first locking feature 152 may also provide a mechanical coupling between the sealing element 130 and the cover 112. Further, the sealing element 130 may extend into the undercut region 144 of the enclosure 102, thereby forming a second locking feature 154. The second locking feature 154 may include a portion of the sealing element 130 positioned in the undercut region 144 of the enclosure 102. The second locking feature 154 may also provide a mechanical coupling between the sealing element 130 and the enclosure 102. Together, the first locking feature 152 and the second locking feature 154 may provide a mechanical force that retains the cover 112 with the enclosure 102, and may counter forces acting in a direction denoted by an arrow 196.

Also, as shown in FIG. 7, the sealing element 130 may include an interface region 160 defined as region of the sealing element 130 engages both the enclosure 102 and the cover 112. In order to maximize ingress protection for a device, traditional devices (such as watches) may include an increased interface region (as compared to the interface region 160). Accordingly, traditional devices may not include undercuts and/or chamfers. However, the first locking feature 152 and the second locking feature 154 may provide additional protection, in terms of sealing and securing, for the electronic device 100, and the interface region 160 may provide the same or similar ingress protection as traditional devices having no undercuts or chamfered regions. Also, the interface region 160 may expand to include a region or regions associated with an interface between the first locking feature 152 and the cover 112, and also an interface region between the second locking feature 154 and the enclosure 102. Optionally, the electronic device 100 may further include an adhesive layer 158 to secure the sealing element 130 (including the second locking feature 154) with the enclosure 102. This may further improve protection against ingress.

Also, traditional devices may position a sealing element between a cover and an enclosure such that the sealing element is exposed to the ambient environment. However, as shown in FIG. 7, the cover 112 may extend radially outward beyond the sealing element 130 to engage the enclosure 102 at the support member 146 such that the cover 112 and the enclosure 102 combine to shield the sealing element 130 from the ambient environment. In this manner, the cover 112 and the enclosure 102 may limit or prevent the sealing element 130 from exposure to factors that may cause the sealing element 130 to break down, such as sunlight, chemicals, oils, or the like. Accordingly, the cover 112 may combine with the enclosure 102 to hide the sealing element 130.

Figure 8:
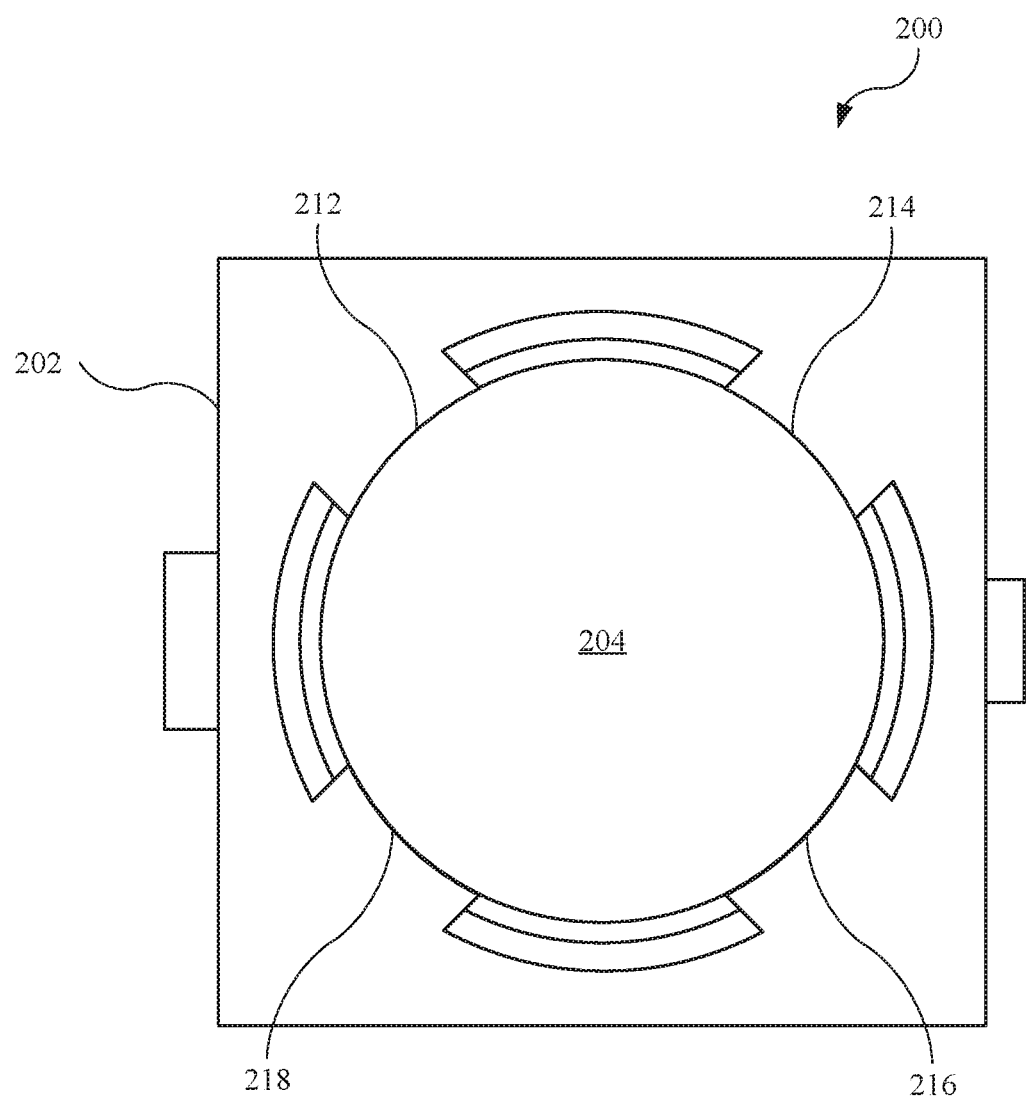
FIG. 8 illustrates a plan view of an alternate embodiment of an electronic device having an enclosure with several flange regions, in accordance with some described embodiments.

FIG. 8 illustrates a plan view of an alternate embodiment of an electronic device 200 having an enclosure with several flange regions, in accordance with some described embodiments. As shown, the electronic device 200 may include an enclosure 202 having multiple flange regions, such as a first flange region 212, a second flange region 214, a third flange region 216, and fourth flange region 218. Also, the aforementioned flange regions may be located at an opening 204 of the enclosure 202, with the opening 204 designed to receive a cover (not shown). While a discrete number of flange regions are shown, the number of flange regions may differ in other embodiments.

Figure 9:
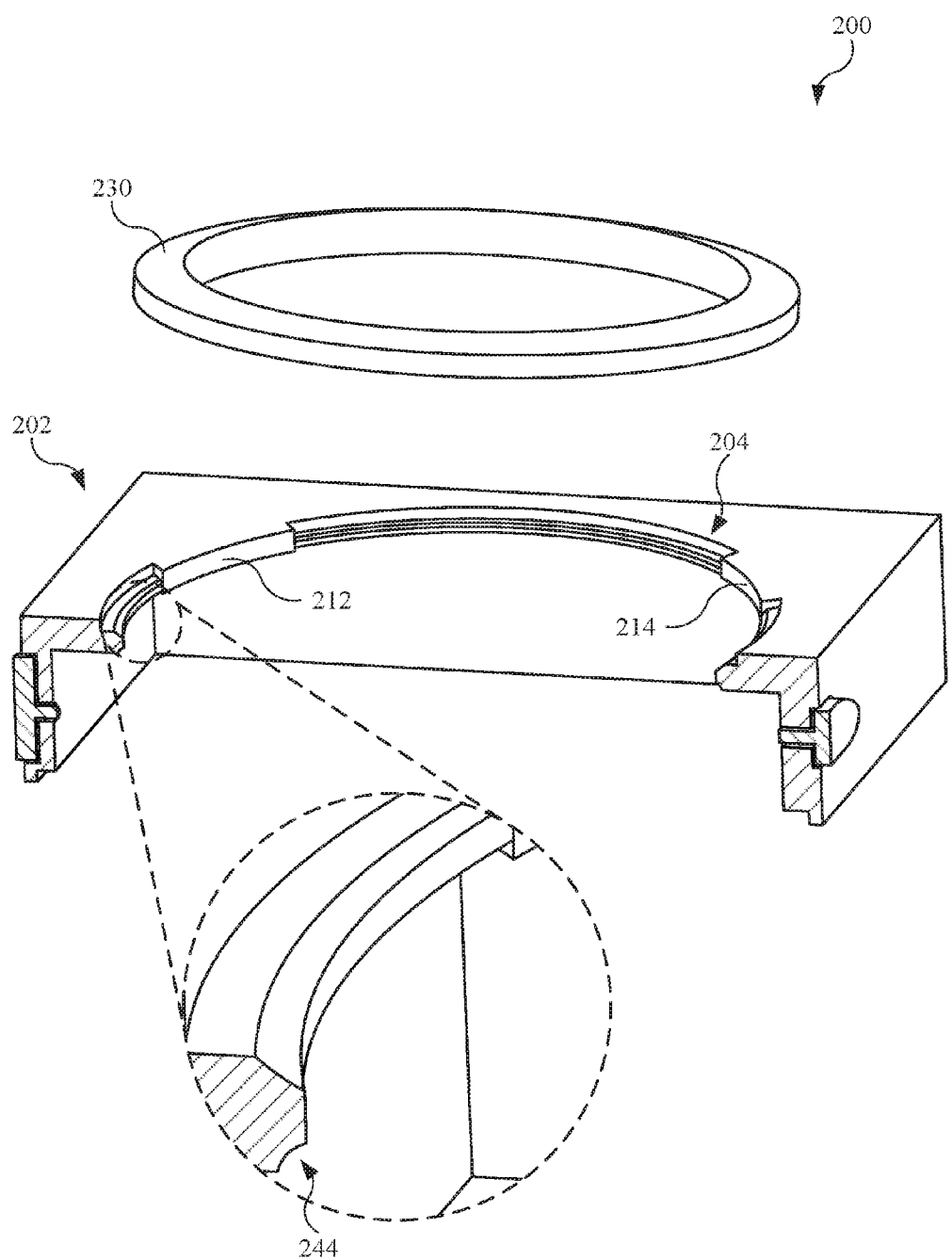
FIG. 9 illustrates a partial cross sectional view of the electronic device shown in FIG. 8.

The flange regions may provide increased surface area of the enclosure 202, which may in turn increase an interface region between the enclosure 202 and a sealing element. For example, FIG. 9 illustrates a partial cross sectional view of the electronic device 200 shown in FIG. 8. Several components of the electronic device 200 removed for purpose of simplicity. However, the electronic device 200 may include any component previously described for an electronic device. Also, the electronic device 200 may include a sealing element 230 designed to engage the enclosure 202 and seal a cover (not shown) with the enclosure 202. Accordingly, the aforementioned flange region of enclosure 202 may cause additional compression to the sealing element 230. Also, as shown in the enlarged view, the enclosure 202 may include an undercut 244 extending along the opening 204 in locations other than the flange regions. In this regard, the flange regions, having no undercut region, provide additional material to facilitate compression of the sealing element 230 in order to enhance the sealing effect thereby improving ingress protection.

Figure 10:
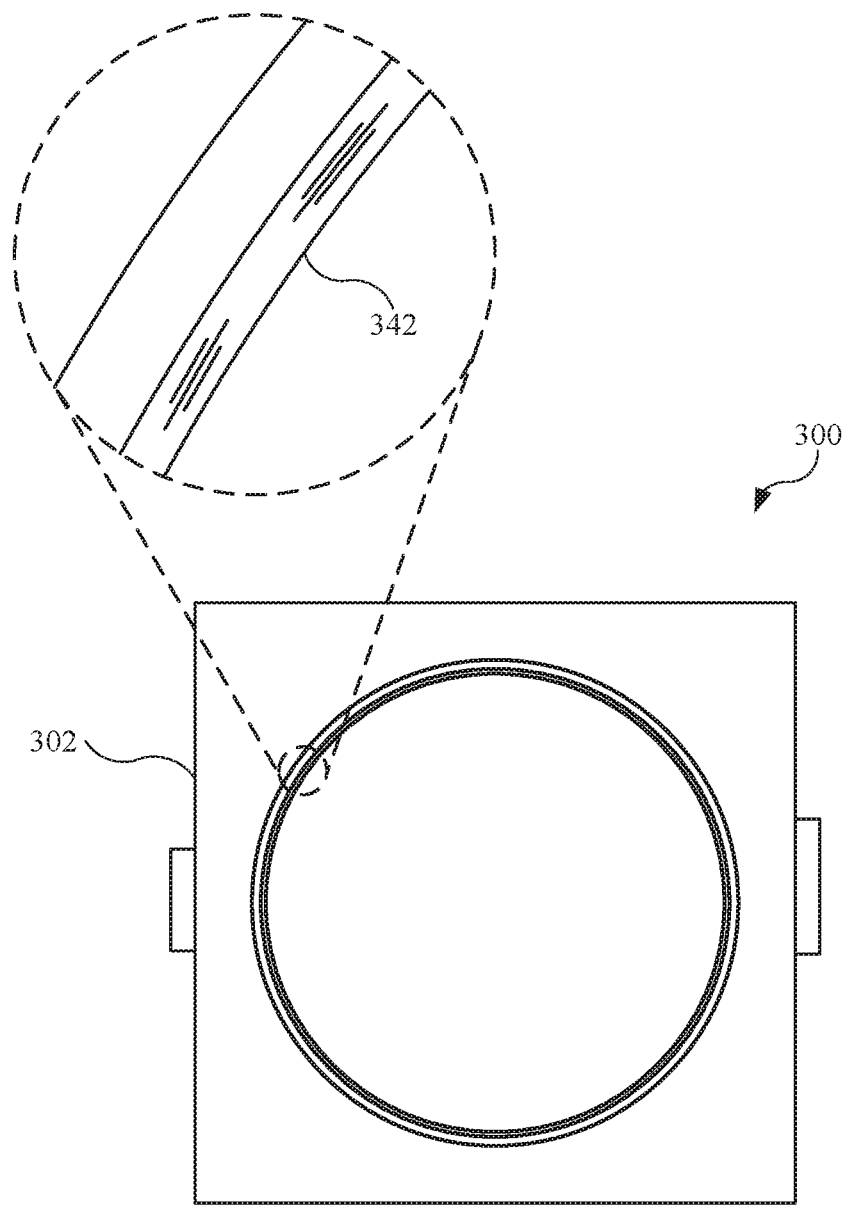
FIG. 10 illustrates a plan view an alternate embodiment of an electronic device that includes an enclosure having a chamfered region after undergoing a polishing operation, in accordance with some described embodiments.

FIG. 10 illustrates a plan view an alternate embodiment of an electronic device 300 that includes an enclosure 302 having a chamfered region 342 after undergoing a polishing operation, in accordance with some described embodiments. As shown, the chamfered region 342 may include a polished surface such that the chamfered region 342 includes a smoother surface as compared to remaining surfaces of the enclosure. Conversely, the chamfered region 342 may include a polished surface such that the chamfered region 342 includes a roughness less than the remaining surfaces of the enclosure 302.

Figure 11:
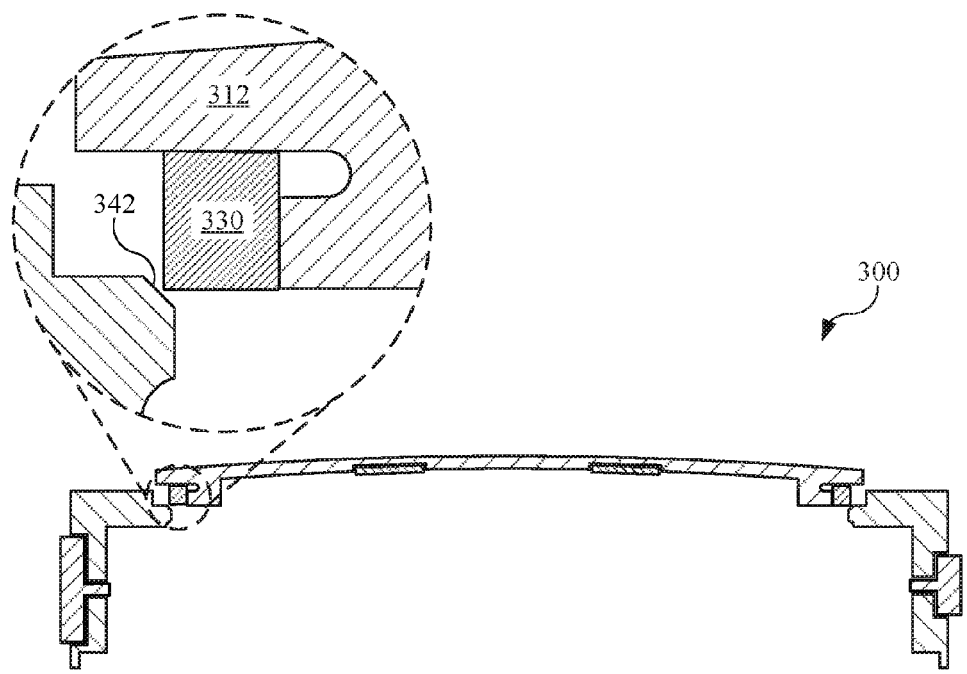
FIG. 11 illustrates a cross sectional view of the electronic device shown in FIG. 10, showing a cover prior to securing with the enclosure.

Having a relatively smooth surface, the chamfered region 342 may facilitate installation of a sealing element-cover combination to an enclosure. For example, FIG. 11 illustrates a cross sectional view of the electronic device 30 shown in FIG. 10, showing a cover 312 prior to securing with the enclosure 302. As shown, during installation of the cover 312, the cover 312 may be designed such that the sealing element 330 initially engages the chamfered region 342. In this regard, the chamfered region 342 may be referred to as a "leading edge." Due in part to the smooth, polished finish of the chamfered region 342, the chamfered region 342 allows the sealing element 330 to slide along the enclosure 302, as the frictional forces of the chamfered region 342 are reduced based on the aforementioned polishing operation. Also, in some embodiments, the sealing element 330 includes a chamfered region. In the embodiment shown in FIG. 11, the sealing element 330 does not include a chamfered region, as the chamfered region 342, having a smooth finish, provides sufficient enablement of the sealing element 330 to slide along the enclosure 302.

Figure 12:
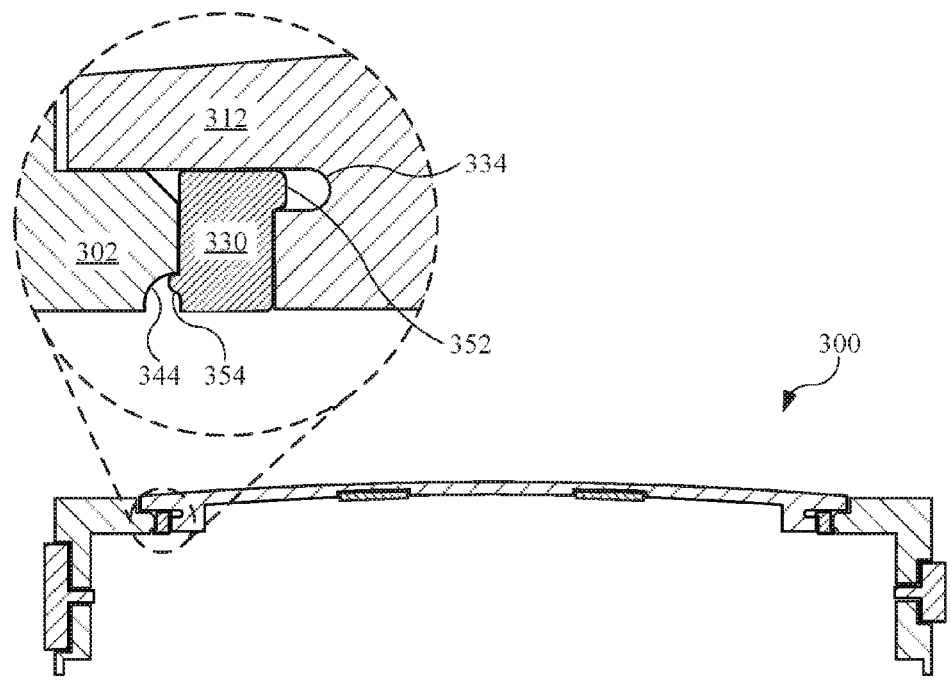
FIG. 12 illustrates a cross sectional view of the electronic device shown in FIG. 11, showing the cover secured with the enclosure.

FIG. 12 illustrates a cross sectional view of the electronic device 300 shown in FIG. 11, showing the cover 312 secured with the enclosure 302. The enclosure 302 and the cover 312 may provide radial compression forces to the sealing element 330. The enclosure 302 and the cover 312 may also include undercut regions. In this regard, similar to a manner previously described, the radial compression forces provided by the enclosure 302 and the cover 312 may cause the sealing element 330 to extend into an undercut region 334 of the cover 312 to form a first locking feature 352, and an undercut region 344 of the enclosure 302 to form a second locking feature 354.

Figure 13:
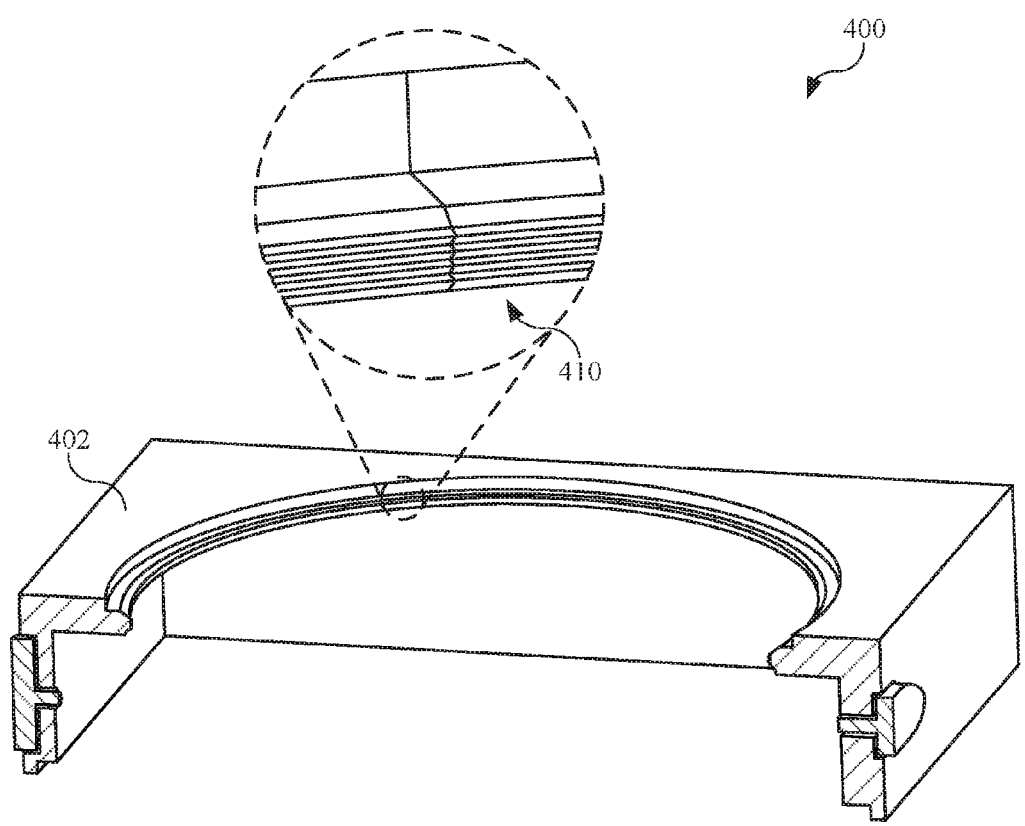
FIG. 13 illustrates a partial cross sectional view an alternate embodiment of an electronic device having an enclosure with a threaded region, in accordance with some described embodiments.

FIG. 13 illustrates a partial cross sectional view an alternate embodiment of an electronic device 400 having an enclosure 402 with a threaded region 410, in accordance with some described embodiments. Several components of the electronic device 400 are removed for purposes of simplicity. However, the electronic device 400 may include several features and components previously described for an electronic device. The threaded region 410 may provide a non-planar surface that provides an enhanced attachment with a sealing element (not shown). As shown in the enlarged view, the threaded region 410 may include several threads, similar to those of a threaded fastener.

Figure 14:
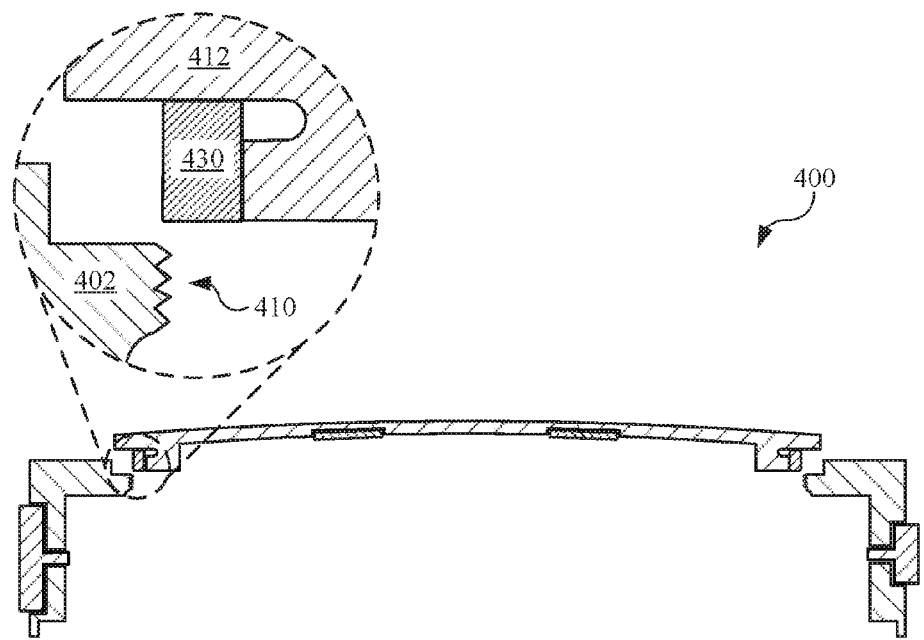
FIG. 14 illustrates a cross sectional view of the electronic device shown in FIG. 13, showing a cover prior to securing with the enclosure.

FIG. 14 illustrates a cross sectional view of the electronic device 400 shown in FIG. 13, showing a cover 412 prior to securing with the enclosure 402. As shown in the enlarged view, a sealing element 430 may include elastic properties that cause the sealing element 430 to deform when the cover 412 is secured with the enclosure 402, and in particular, with the threaded region 410. The sealing element 430 may include any material or property previously described for a sealing element.

Figure 15:
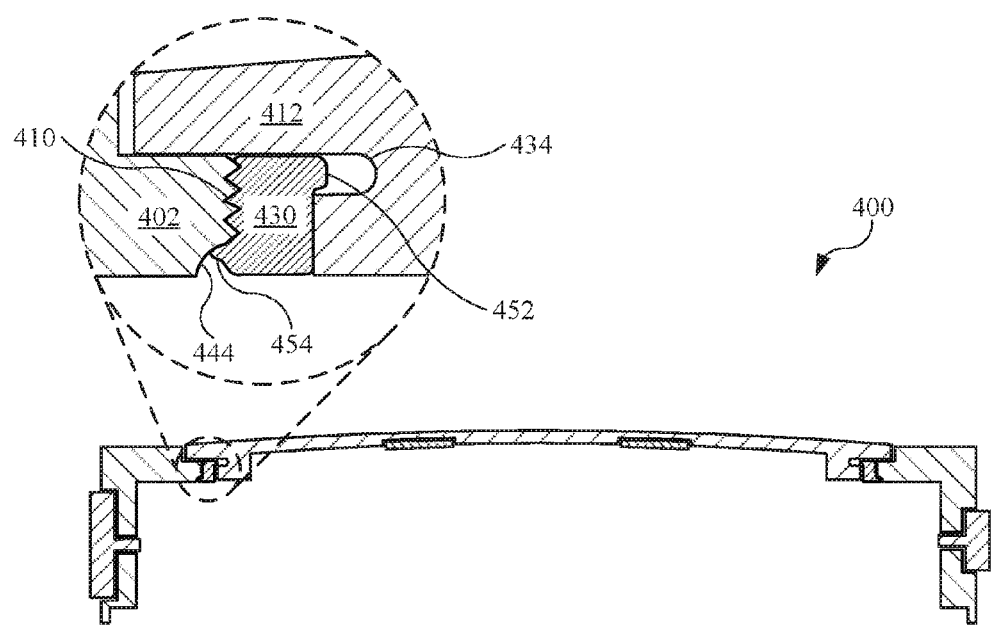
FIG. 15 illustrates a cross sectional view of the electronic device shown in FIG. 14, showing the cover secured with the enclosure.

FIG. 15 illustrates a cross sectional view of the electronic device 400 shown in FIG. 14, showing the cover 412 secured with the enclosure 402. The enclosure 402 and the cover 412 may provide radial compression forces to the sealing element 430. The enclosure 402 and the cover 412 may also include undercut regions. In this regard, similar to a manner previously described, the radial compression forces provided by the enclosure 402 and the cover 412 may cause the sealing element 430 to extend into an undercut region 434 of the cover 412 to form a first locking feature 452, and an undercut region 444 of the enclosure 402 to form a second locking feature 454. Also, as shown in FIG. 15, the radial compression forces may cause the sealing element 430 to extend into the threaded region 410 of the enclosure 402, thereby by forming a mechanical attachment between the sealing element 430 and the enclosure 402. This may provide additional resistance against a force to the electronic device 400 that would otherwise cause the cover 412 to decouple from the enclosure 402. Also, in some embodiments (not shown), the enclosure 402 includes a roughened region that replaces the threaded region 410. The roughened region may provide additional frictional forces between the enclosure 402 and the sealing element 430. The roughened region of the enclosure 402 may be formed by, for example, sandblasting the enclosure 402.

Figure 16:
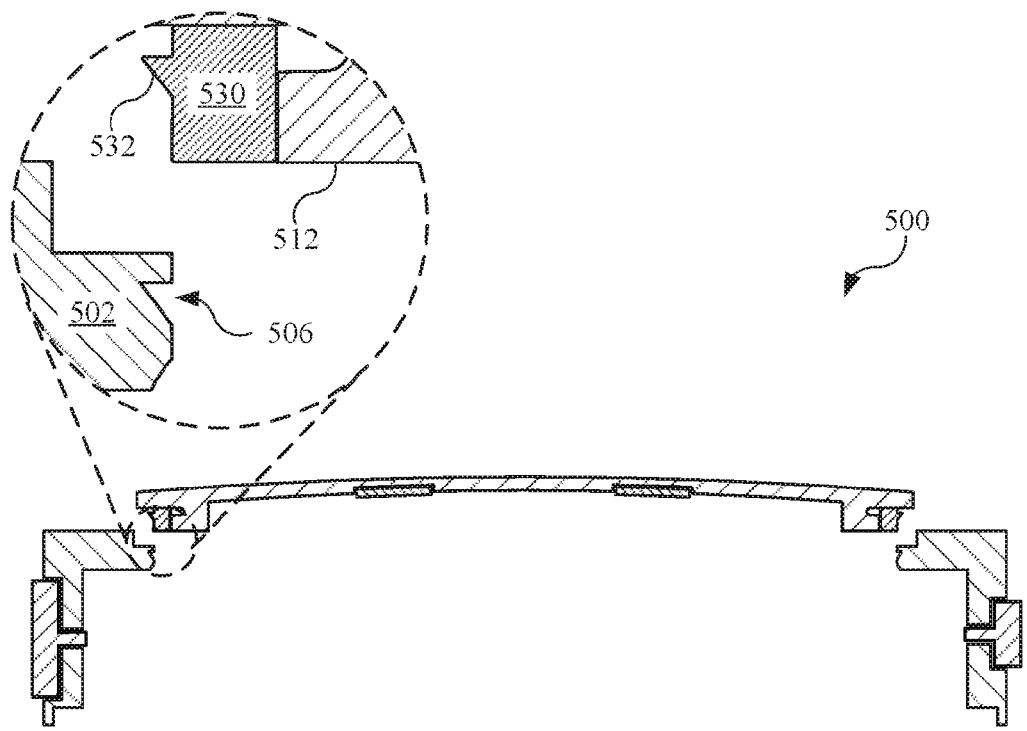
FIG. 16 illustrates a cross sectional view of an alternate embodiment of an electronic device having a sealing element with a protruding feature corresponding to an indented region of an enclosure of the electronic device, in accordance with some described embodiments.

Rather than several threads, an enclosure may include a single indented feature. For example, FIG. 16 illustrates a cross sectional view of an alternate embodiment of an electronic device 500 having a sealing element 530 with a protruding feature 532 and an enclosure 502 with an indented region 506, in accordance with some described embodiments. As shown in the enlarged view, the indented region 506 may include a size and shape generally corresponding to that of the protruding feature 532. Several components of the electronic device 500 are removed for purposes of simplicity. However, the electronic device 500 may include several features and components previously described for an electronic device.

Figure 17:
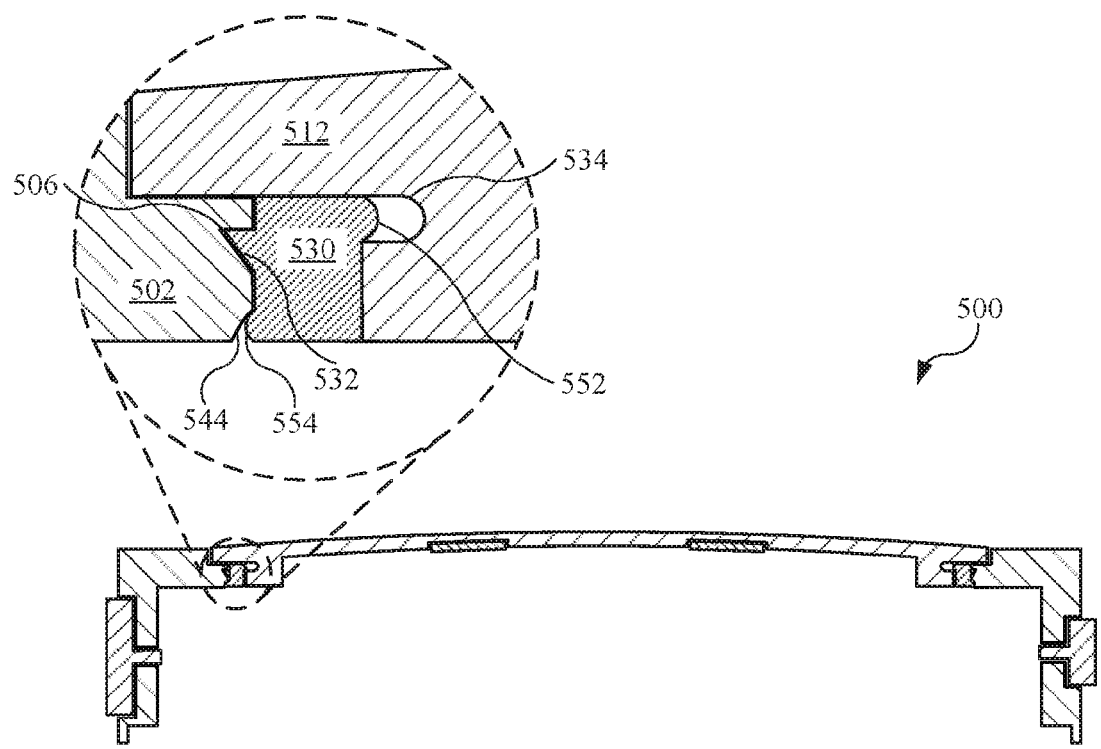
FIG. 17 illustrates a cross sectional view of the electronic device shown in FIG. 16, showing the cover secured with the enclosure.

FIG. 17 illustrates a cross sectional view of the electronic device 500 shown in FIG. 16, showing the cover 512 secured with the enclosure 502. As shown, the enclosure 502 and the cover 512 may provide radial compression forces to the sealing element 530. The enclosure 502 and the cover 512 may also include undercut regions. In this regard, similar to a manner previously described, the radial compression forces provided by the enclosure 502 and the cover 512 may cause the sealing element 530 to extend into an undercut region 534 of the cover 512 to form a first locking feature 552, and an undercut region 544 of the enclosure 502 to form a second locking feature 554. Also, as shown in FIG. 17, the radial compression forces may cause the sealing element 530, and particular, the protruding feature 532, to extend into the indented region 506 of the enclosure 502, thereby by forming a mechanical attachment between the sealing element 530 and the enclosure 502. Further, the indented region 506 and the protruding feature 532 are shaped to counter forces to the electronic device 500 that would otherwise cause the cover 512 to decouple from the enclosure 502. It should be noted that the sealing element 530 may be compressed at the protruding feature 532 in order for the cover 512 to couple with the enclosure 502.

Figure 18:
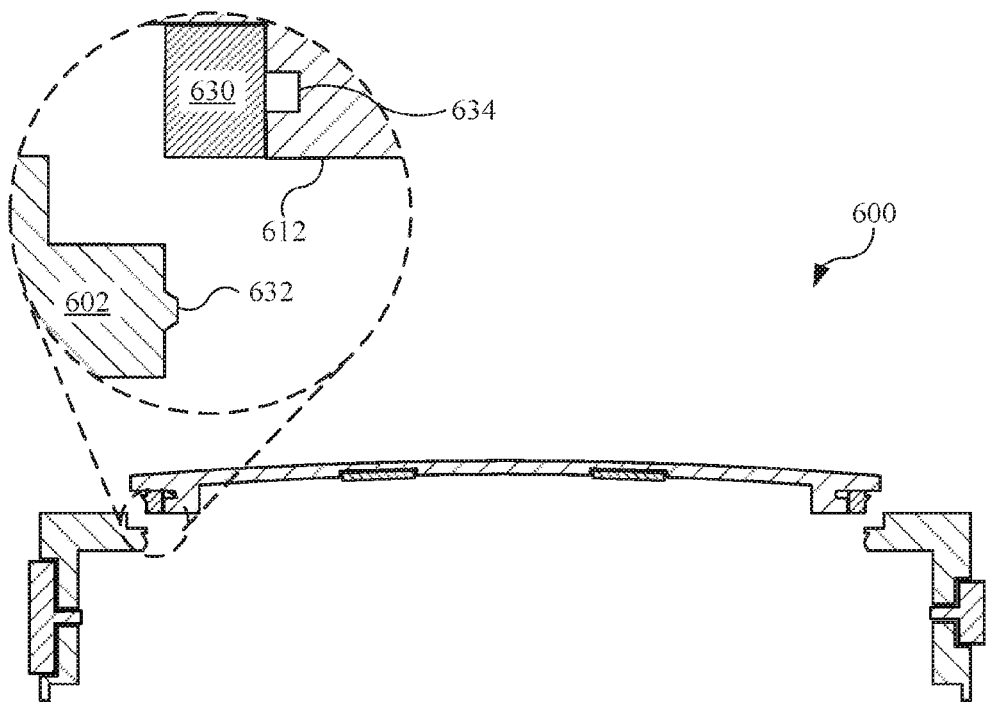
FIG. 18 illustrates a cross sectional view of an alternate embodiment of an electronic device having a sealing element with a rectilinear configuration, in accordance with some described embodiments.

In another embodiment, the enclosure, rather than the sealing element, may include a protruding feature. For example, FIG. 18 illustrates a cross sectional view of an alternate embodiment of an electronic device 600 having a sealing element 630 with a rectilinear configuration, in accordance with some described embodiments. Several components of the electronic device 600 are removed for purposes of simplicity. However, the electronic device 600 may include several features and components previously described for an electronic device. As shown in the enlarged view, the enclosure 602 may include a protruding feature 632 designed to engage the sealing element 630 when the cover 612 is secured with the enclosure 602. Also, the cover 612 may include an undercut region 634. Generally, the protruding feature 632 and the undercut region 634 are centrally located at a surface of their respective components. However, the protruding feature 632 and the undercut region 634 may be positioned in other locations.

Figure 19:
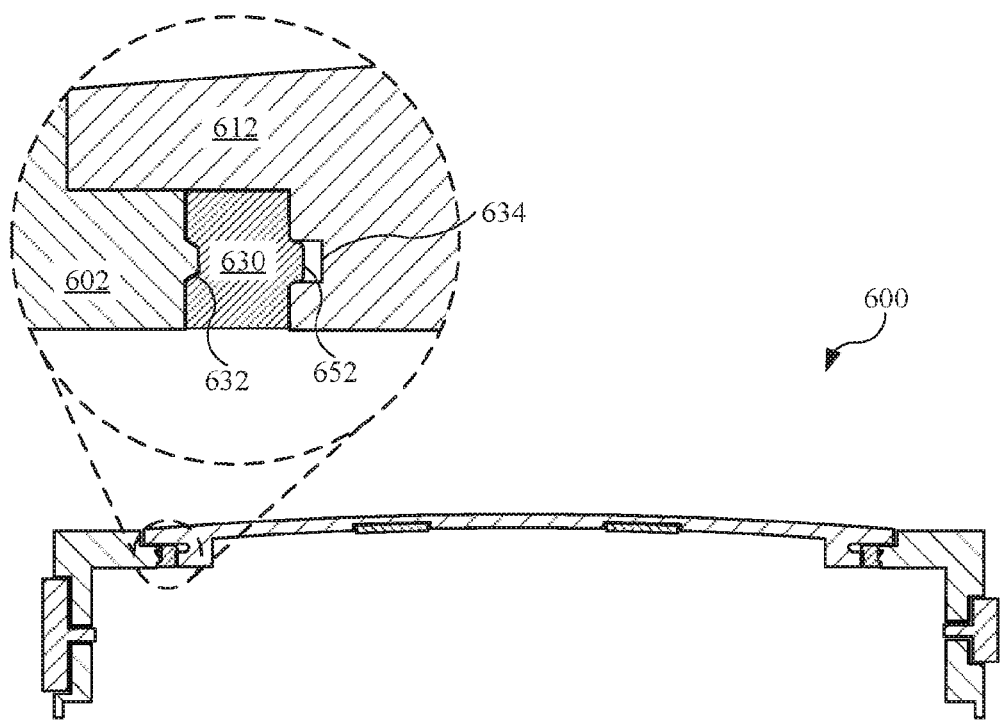
FIG. 19 illustrates a cross sectional view of the electronic device shown in FIG. 18, showing the cover secured with the enclosure 602.

FIG. 19 illustrates a cross sectional view of the electronic device 600 shown in FIG. 18, showing the cover 612 secured with the enclosure 602. As shown, when the cover 612 is secured with the enclosure 602, the enclosure 602 and the cover 612 may provide compression forces to the sealing element 630 to alter its appearance. For example, the enclosure 602, and in particular, the protruding feature 632, may provide a force that elastically deforms the sealing element 630 around the protruding feature 632. This may provide a locking means that prevents or limits movement of the sealing element 630 relative to the enclosure 602. Also, the cover 612 may provide a force that deforms the sealing element 630, causing the sealing element 630 to at least partially extend into the undercut region 634 and define a locking feature 652, thereby preventing or limiting movement of the cover 612 with respect to the sealing element 630.

Figure 20:
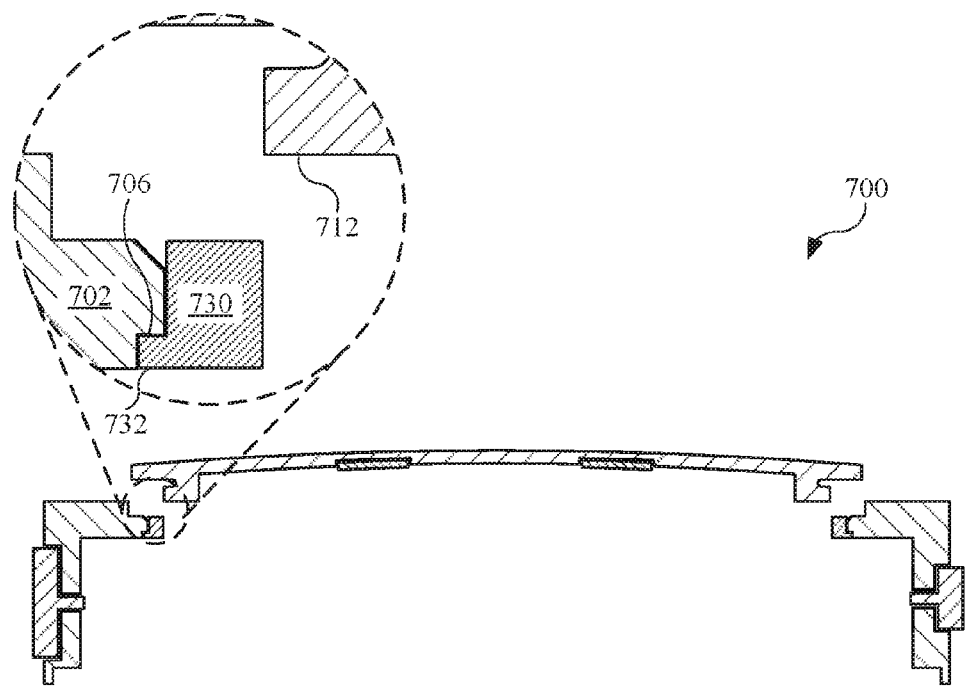
FIG. 20 illustrates a cross sectional view of an alternate embodiment of an electronic device having a sealing element with a protruding feature at an alternate location, with the protruding feature having a shape corresponding to a shape of an indented region of an enclosure of the electronic device, in accordance with some described embodiments.

Rather than a protruding feature that is centrally located (shown in FIGS. 16-19), a protruding feature of a sealing element may be in other locations. For example, FIG. 20 illustrates a cross sectional view of an alternate embodiment of an electronic device 700 having a sealing element 730 with a protruding feature 732 at an alternate location, with the protruding feature having a shape corresponding to an indented region 706 of an enclosure 702 of the electronic device 700, in accordance with some described embodiments. Several components of the electronic device 700 are removed for purposes of simplicity. However, the electronic device 700 may include several features and components previously described for an electronic device. As shown in the enlarged view, the indented region 706 having a size and shape generally corresponding to that of a protruding feature 732 of the sealing element 730. Also, due in part to the size of the protruding feature 732 and its location on the sealing element 730, the sealing element 730 may be installed on the enclosure 702 prior to receiving a cover 712. In this regard, the sealing element 730 may enter through an internal region of the enclosure 702 to engage the indented region 706.

Figure 21:
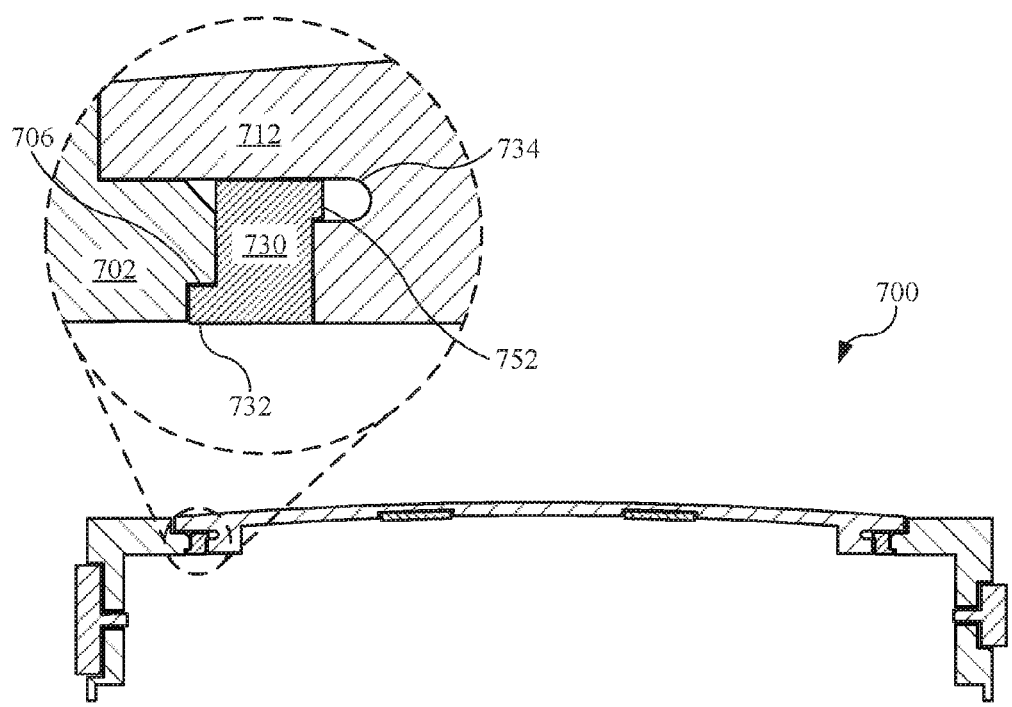
FIG. 21 illustrates a cross sectional view of the electronic device shown in FIG. 20, showing the cover engaging the protruding feature to secure the cover with the enclosure.

FIG. 21 illustrates a cross sectional view of the electronic device 700 shown in FIG. 20, showing the cover 712 engaging the protruding feature 732 to secure the cover 712 with the enclosure 702. The cover 712 may be secured with the enclosure 702 and sealing element 730 in a process subsequent to the sealing element 730 being secured with the enclosure 702. As shown, the enclosure 702 and the cover 712 may provide radial compression forces to the sealing element 730. The enclosure 702 may also include an undercut region. In this regard, similar to a manner previously described, the radial compression forces provided by the enclosure 702 and the cover 712 may cause the sealing element 730 to extend into an undercut region 734 of the cover 712 to form a first locking feature 752. Also, as shown in FIG. 21, the radial compression forces may cause the sealing element 730, and particular, the protruding feature 732, to extend into the indented region 706 of the enclosure 702, thereby by forming an additional locking feature by a mechanical attachment between the sealing element 730 and the enclosure 702. Further, the indented region 706 and the protruding feature 732 are shaped to counter forces to the electronic device 700 that would otherwise cause the cover 712 to decouple from the enclosure 702. It should be noted that the sealing element 730 may be compressed at the protruding feature 732 in order for the cover 712 to couple with the enclosure 702.

The sealing elements may deform by methods other than just radial compression. For example, FIGS. 22-25 describe a method for applying heat to deform a sealing element by melting the sealing element. This may be referred to as a heat staking process. The sealing element shown in FIGS. 22-25 may be oversized, then melted to conform to other features of an electronic device.

Figure 22:
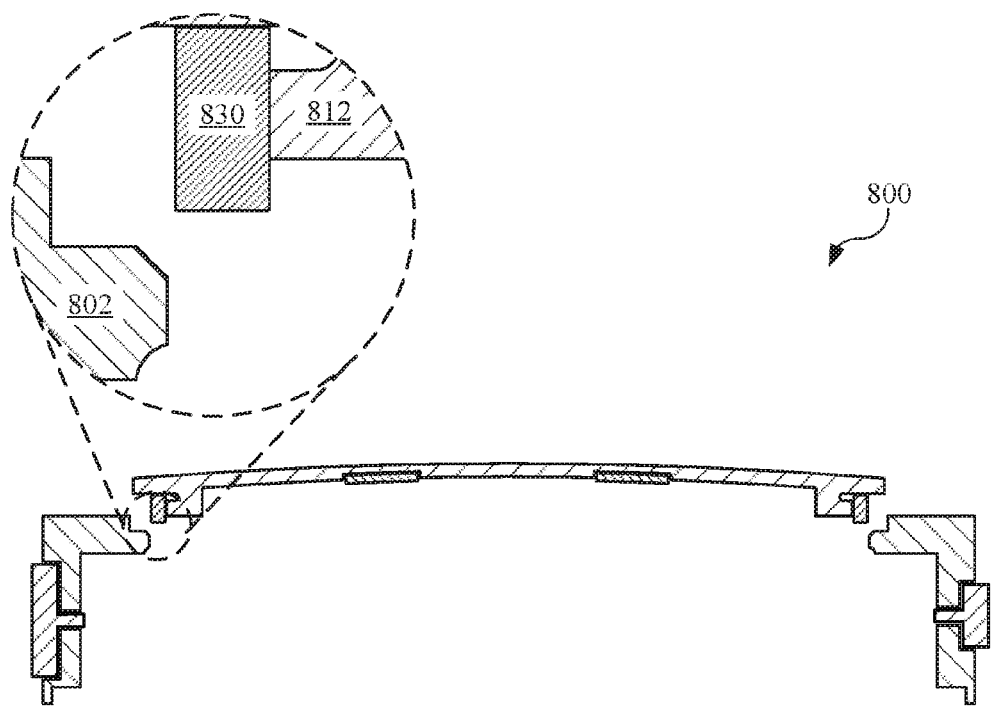
FIG. 22 illustrates a cross sectional view of an alternate embodiment of an electronic device having a sealing element secured with a cover, showing the cover prior to securing with an enclosure of the electronic device, in accordance with some embodiments.

FIG. 22 illustrates a cross sectional view of an alternate embodiment of an electronic device 800 having a sealing element 830 secured with a cover 812, showing the cover 812 prior to securing with an enclosure 802 of the electronic device 800, in accordance with some embodiments. As shown, the sealing element 830 may extend beyond the cover 812. Also, several components of the electronic device

800 are removed for purposes of simplicity. However, the electronic device 800 may include several features and components previously described for an electronic device.

Figure 23:
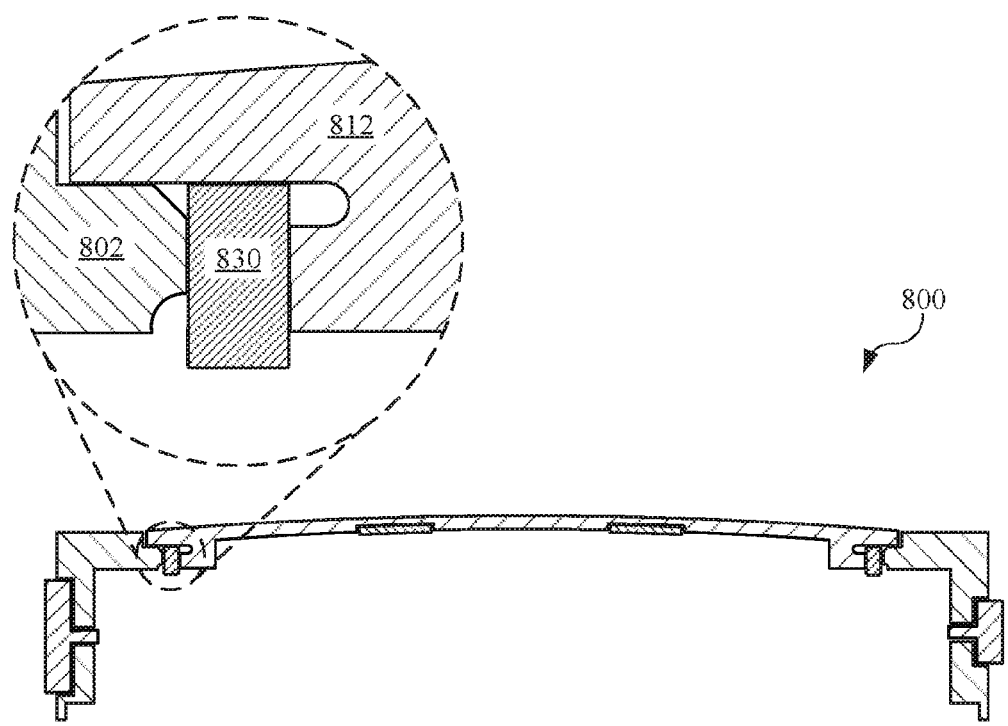
FIG. 23 illustrates a cross sectional view of the electronic device shown in FIG. 22, showing the cover secured with the enclosure.

FIG. 23 illustrates a cross sectional view of the electronic device shown in FIG. 22, showing the cover 812 secured with the enclosure 802. As shown, the sealing element 830 may engage both the enclosure 802 and the cover 812. Further, the sealing element 830 may extend beyond the enclosure 802. While the cover 812 and/or the enclosure 802 may apply radial compression forces, the sealing element 830 may include a size and a shape that provides minimal engagement with the cover 812 and/or the enclosure 802. Thing may facilitate installing and securing the cover 812 with the enclosure 802, as the sealing element 830 may readily slide along the enclosure 802.

Figure 24:
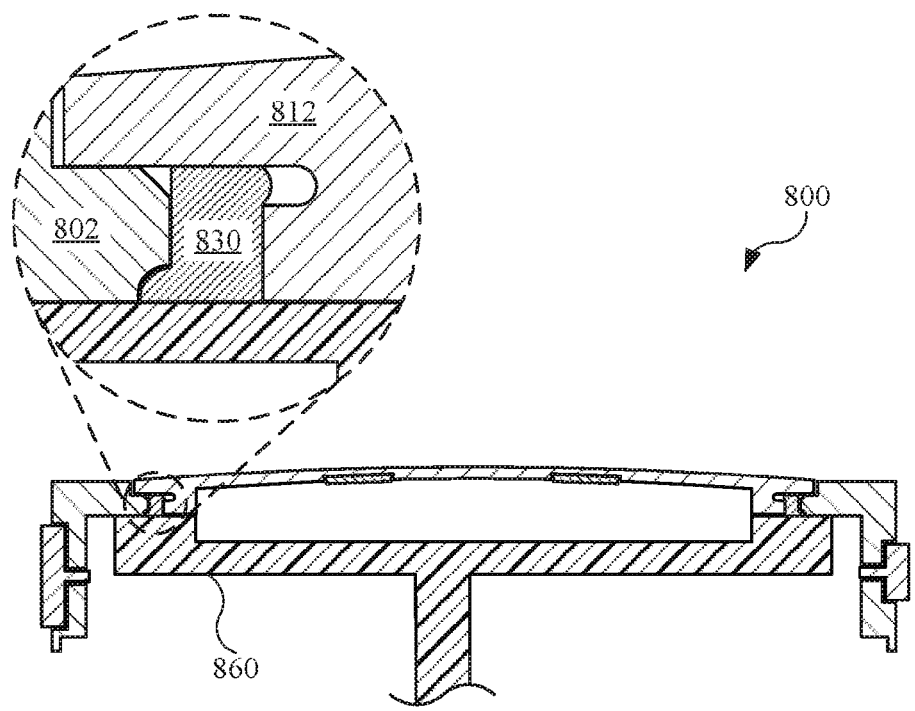
FIG. 24 illustrates a cross sectional view of the electronic device shown in FIG. 23, showing a heating element engaging the sealing element to at least partially melt the sealing element.
Figure 25:
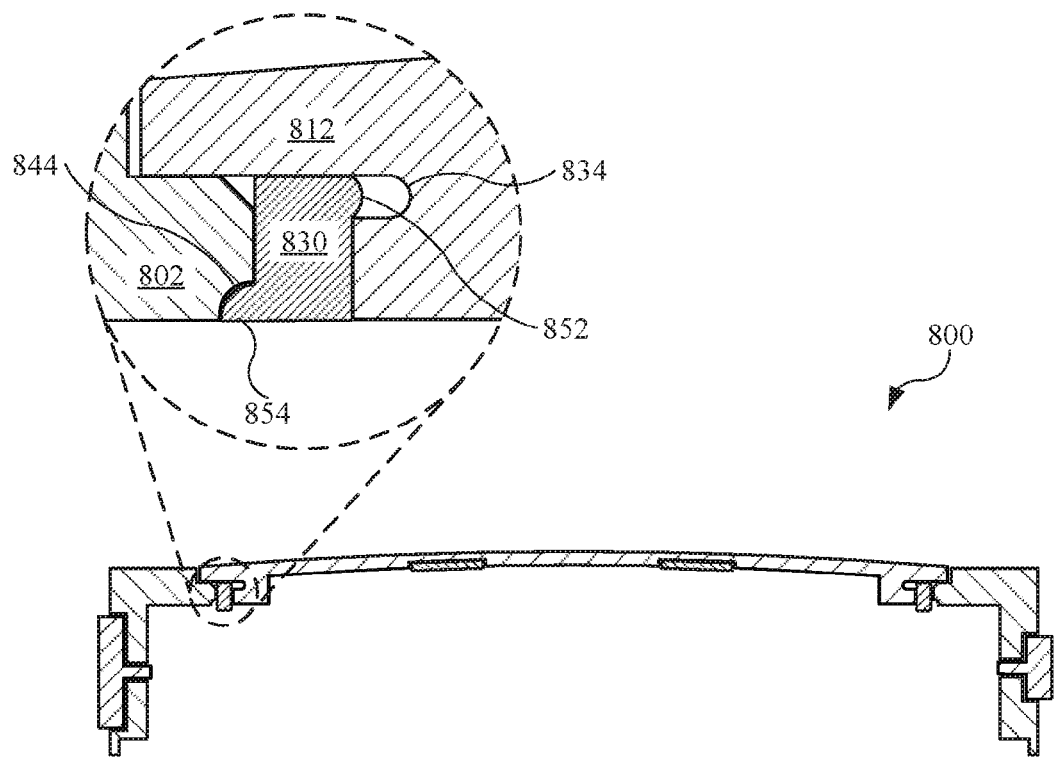
FIG. 25 illustrates a cross sectional view of the electronic device shown in FIG. 24, with the heating element removed subsequent to melting the sealing element.

FIG. 24 illustrates a cross sectional view of the electronic device 800 shown in FIG. 23, showing a heating element 860 engaging the sealing element 830 to at least partially melt the sealing element 830. The heating element 860 may provide sufficient heat to melt the sealing element 830, causing the sealing element 830 to reduce in size and become co-planar, or flush, with respect to a surface of the enclosure 802 and a surface of the cover 812, as shown in FIG. 24. FIG. 25 illustrates a cross sectional view of the electronic device 800 shown in FIG. 24, with the heating element 860 (shown in FIG. 24) removed subsequent to melting the sealing element 830. As shown, the melting of the sealing element 830 may cause the sealing element 830 to extend into an undercut region 844 of the enclosure 802. Also, the heating element 860 (shown in FIG. 24) may provide not only heat to the sealing element 830, but may also provide some axial force such that the sealing element 830, while heated, extends into an undercut region 834 of the cover 812. In this regard, the melting of the sealing element 830 may cause the sealing element 830 to form a first locking feature 852 (at the undercut region 834) and a second locking feature 854 (at the undercut region 844).

The prior embodiments show and describe a sealing element that may be used to secure a cover with a rear portion of the enclosure. However, as shown in previous embodiments, electronic devices may include an outer protective cover designed to overlay a display assembly. Some methods described for a sealing element may be used to secure the outer protective layer with the enclosure at a front region of an electronic device.

Figure 26:
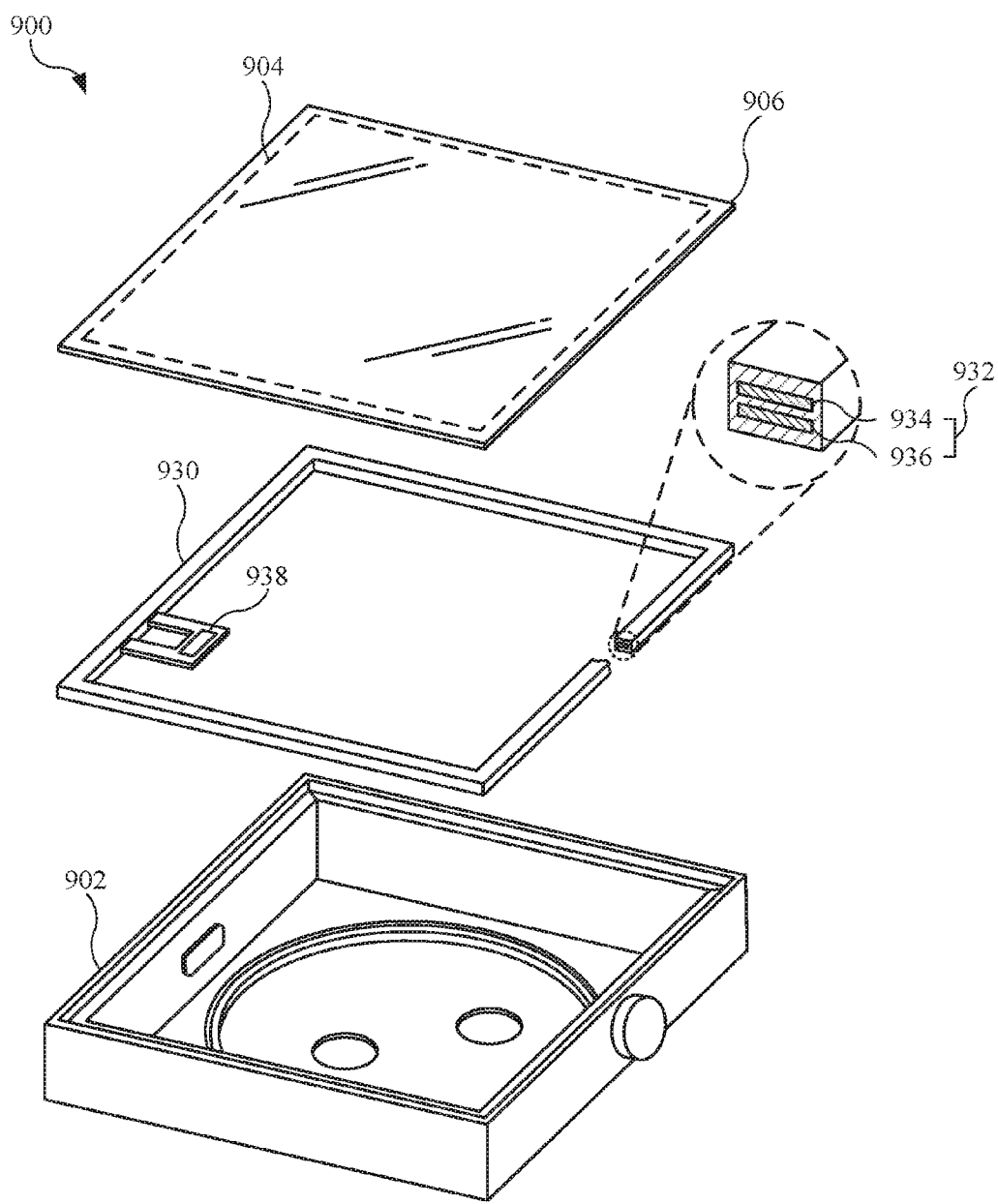
FIG. 26 illustrates an exploded view of an alternate embodiment of an electronic device having a sealing element used with an outer protective cover and a display assembly of the electronic device, in accordance with some described embodiments.
Figure 27:
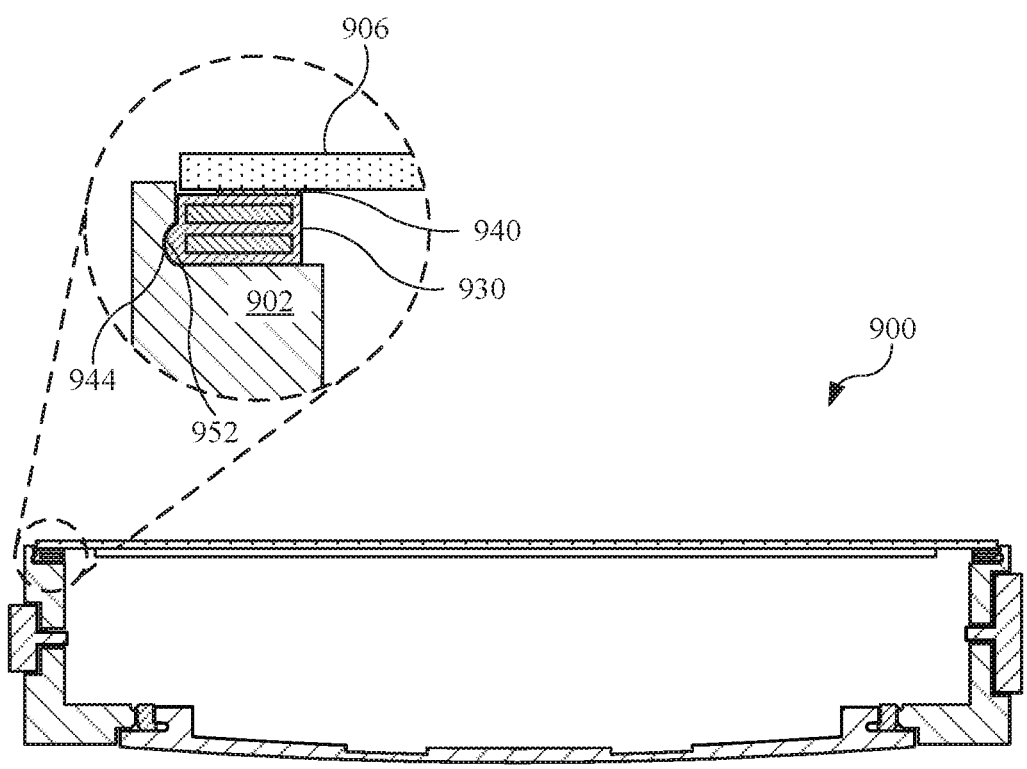
FIG. 27 illustrates a cross sectional view of the electronic device shown in FIG. 26, showing the outer protective layer secured with the enclosure.

For example, FIGS. 26 and 27 illustrate a sealing element that may be used to secure the outer protective cover with an enclosure of an electronic device. FIG. 26 illustrates an exploded view of an alternate embodiment of an electronic device 900 having a sealing element 930 used with an outer protective layer 906 and a display assembly 904 of the electronic device 900 in accordance with some described embodiments. The display assembly 904 and outer protective layer 906 may include any features or properties previously described for a display assembly and an outer protective layer, respectively. Also, the sealing element 930 may include materials and elastic features previously described for a sealing element. However, as shown in the enlarged view, the sealing element 930 may include a sensor system 932 embedded in the sealing element 930.

In some embodiments, the sensor system 932 is a capacitive sensor system. In this regard, the sensor system 932 may include a first plate 934 and a second plate 936, both of which may be electrically coupled with a circuit 938 and a power source (not shown). At least one of the first plate 934 or the second plate 936 may receive power to store charge, such that at least one of the plates includes a capacitance between the first plate 934 and the second plate 936. The capacitance may be inversely proportional to a distance between the first plate 934 and the second plate 936. In this regard, the capacitive may be altered (increased, for example) in response to a force applied to the outer protective layer 906 that causes the first plate 934 to move in a direction toward the second plate 936, thereby reducing the distance between the first plate 934 and the second plate 936.

FIG. 27 illustrates a cross sectional view of the electronic device 900 shown in FIG. 26, showing the outer protective layer 906 secured with the enclosure 902. Several components of the electronic device 900 are removed for purposes of simplicity. However, the electronic device 900 may include several features and components previously described for an electronic device. In some embodiments (not shown), the outer protective layer 906 extends to allow the sealing element 930 to be press fit onto the outer protective layer 906. In the embodiment shown in FIG. 27, the sealing element 930 is secured with the outer protective layer 906 by an adhesive 940. In some embodiments, the sealing element 930 is adhesively secured with the enclosure 902 by an adhesive (not shown).

As shown in FIG. 27, the enclosure 902 may include an undercut region 944. In this regard, when the outer protective layer 906 is secured with the enclosure 902, the outer protective layer 906 and/or the enclosure 902 may provide compression forces to the sealing element 930, causing the sealing element 930 to at least partially extend into the undercut region 944 and form a locking feature 952 between the enclosure 902 and the sealing element 930. Accordingly, a sealing element may be used to provide mechanical locking features in different locations, and for different structural components, of an electronic device.

Figure 28:
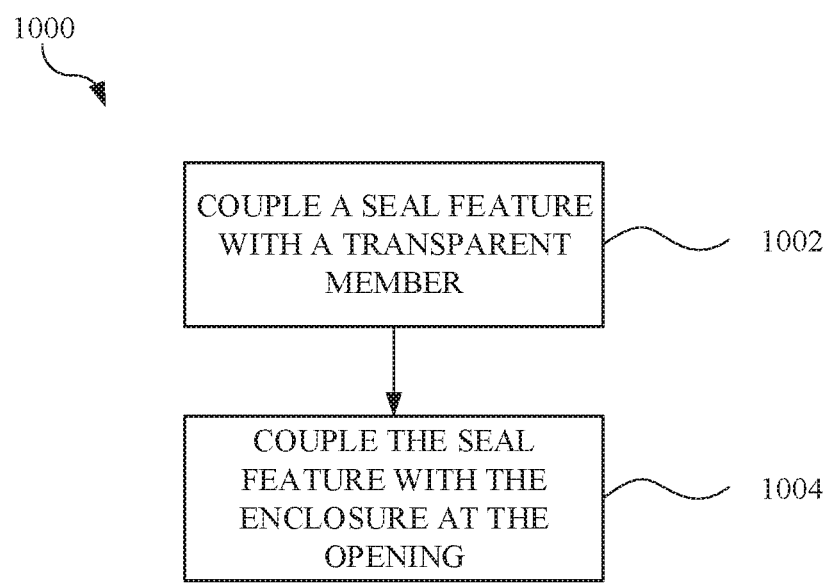
FIG. 28 illustrates a flowchart showing a method for forming an electronic device having an enclosure that includes an opening and an enclosure undercut surrounding the opening, in accordance with some described embodiments.

FIG. 28 illustrates a flowchart 1000 showing a method for forming an electronic device having an enclosure that includes an opening and an enclosure undercut surrounding the opening, in accordance with some described embodiments. In step 1002, a sealing element is coupled with a cover. The sealing element may include elastically deformable properties and may be formed from materials such as PTFE or ETFE. The cover may be made from a material such as glass, sapphire, or crystal, such that light may pass through the transparent material. Further, the sealing element may be press fit onto the cover, and optionally, may also be adhesively secured with the cover.

In step 1004, the sealing element and the cover are coupled with the enclosure at the opening. The cover may include a cover undercut that includes an undercut region formed by a material removal process to the cover. When the cover is coupled with the enclosure, radial compression forces may cause the sealing element to extend and engage: 1) the cover undercut to define a first locking feature and 2) the enclosure undercut to define a second locking feature. In this regard, the sealing element may be at least partially disposed between the cover and the enclosure.

The first locking feature may combine with the second locking feature to provide a retaining force that maintains the cover (along with the sealing element) secured with the enclosure. Also, the enclosure and/or the cover may provide radial compression force in opposing directions (both of which are directed toward the sealing element). In response, the sealing element may provide counterforces in a radially outward direction (with respect to the sealing element), thereby providing an additional retaining force that maintains the cover (along with the sealing element) with the enclosure. Also, the enclosure may be formed from a material such as steel or aluminum, or alloys that include at least one of the aforementioned metals. Also, the enclosure undercut may include an undercut region formed by a material removal process to the enclosure.

Figure 29:
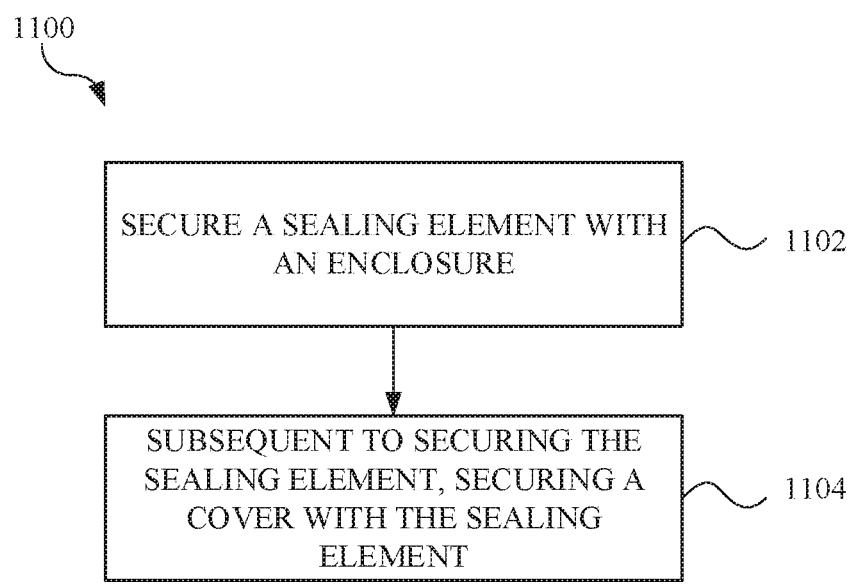
FIG. 29 illustrates a flowchart showing a method for assembling an electronic device, in accordance with some described embodiments.

FIG. 29 illustrates a flowchart 1100 showing a method for assembling an electronic device, in accordance with some described embodiments. In step 1102, a sealing element is secured with an enclosure of the electronic device. In some embodiments, the enclosure includes an indented region and the sealing element includes a protruding feature designed to mate with the recessed region. Further, the protruding feature may be located at a bottommost portion of the sealing element. However, in other embodiments, the protruding feature is centrally located on the sealing element.

In step 1104, a cover is secured with the enclosure subsequent to securing the sealing element with the enclosure. The cover may combine with the enclosure to provide compression forces to the sealing element. In response, the sealing element may extend into an undercut region of the cover, and the sealing element may provide a locking feature. Further, the sealing element, having the protruding feature disposed in the indented region, may provide an additional locking feature to retain the cover with the enclosure and enhance ingress protection.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A watch, comprising:
    an enclosure having an opening and an enclosure undercut surrounding the opening;
    a cover carried by the enclosure at the opening, the cover comprising a cover undercut; and
    a sealing element securing the cover with the enclosure, wherein an engagement by the cover and the enclosure to the sealing element causes the sealing element to expand and engage: 1) the enclosure undercut to define a first locking feature and 2) the cover undercut to define a second locking feature, wherein the first locking feature and the second locking feature combine to retain the cover with the enclosure.

2. The watch of claim 1, wherein the sealing element, in response to a force provided by at least one of the enclosure and the cover, elastically deforms to engage the enclosure undercut and the cover undercut.

3. The watch of claim 1, wherein the enclosure comprises a support member that receives the cover, and wherein the cover extends beyond the sealing element to engage the support member such the sealing element is enclosed between the cover and the enclosure.

4. The watch of claim 1, wherein the enclosure comprises a threaded region that combines with the enclosure under to define an interface region that at least partially engages the sealing element.

5. The watch of claim 1, wherein the sealing element is secured with the enclosure by an adhesive.

6. The watch of claim 1, wherein the enclosure comprises a flange region that compresses the sealing element, and wherein the enclosure undercut is located at the opening in regions other than the flange region.

7. The watch of claim 1, wherein the cover extends radially outward beyond the sealing element to engage the enclosure such that the sealing element is hidden from view.

8. The watch of claim 1, wherein the sealing element comprises a first chamfered region that deforms to define the second locking feature that engages the enclosure undercut.

9. A wearable electronic device, comprising:
    a first part;
    a second part; and
    a sealing element comprising a first surface that engages the first part and a second surface that engages the second part such that the sealing element is positioned between the first part and the second part, the sealing element elastically deforming in a first direction and a second direction opposite the first direction when the first part is coupled with the second part.

10. The electronic device of claim 9, wherein the first part comprises an undercut, and wherein the sealing element at least partially extends into the undercut.

11. The electronic device of claim 10, wherein the second part comprises a second undercut, and wherein the sealing element at least partially extends into the second undercut.

12. The electronic device of claim 9, wherein the second part comprises a support member that receives the first part, and wherein the first part extends radially outward beyond the sealing element to engage the support member such the sealing element is enclosed between the first part and the second part.

13. The electronic device of claim 9, wherein the first part comprises ceramic, and wherein the second part comprises sapphire that includes an undercut that at least partially receives the sealing element.

14. The electronic device of claim 9, wherein the
    a second surface is parallel with respect to the first surface, and
    wherein the sealing element further comprises a chamfered region angled with the respect to the first surface and the second surface.

15. A method for assembling a watch having an enclosure that includes an opening and an enclosure undercut surrounding the opening, the method comprising:
    coupling a sealing element with a cover that comprises a cover undercut; and
    coupling the sealing element and the cover with the enclosure at the opening, wherein coupling the cover with the enclosure causes the sealing element to extend and engage: 1) the cover undercut to define a first locking feature and 2) the enclosure undercut to define a second locking feature, wherein the first locking feature and the second locking feature combine to retain the cover with the enclosure.

16. The method of claim 15, further comprising:
    forming a threaded region on the enclosure along the opening; and
    engaging the sealing element with the enclosure at the threaded region.

17. The method of claim 15, further comprising:
    forming a flange region on the enclosure along the opening; and
    engaging a recessed region of the sealing element with the enclosure at the flange region.

18. The method of claim 15, wherein coupling the cover with the enclosure at the opening comprises coupling the cover with a support member of the enclosure, wherein the cover extends radially outward beyond the sealing element to engage the support member such the sealing element is enclosed between the cover and the enclosure.

19. The method of claim 15, further comprising heating the sealing element to melt the sealing element into the enclosure undercut.

20. The method of claim 15, further comprising polishing the enclosure to define a polished region having a first roughness, wherein a remaining region of the enclosure comprises a second roughness greater than the first roughness, and wherein the sealing element passes along the enclosure at the polished region.

* * * * *